United States Patent
Fuchs et al.

(10) Patent No.: US 7,463,782 B2
(45) Date of Patent: Dec. 9, 2008

(54) DATA ENCODING WITH AN AMPLITUDE MODEL AND PATH BETWEEN THE DATA AND CORRESPONDING DECODING

(75) Inventors: Guillaume Fuchs, Ergue Gaberic (FR); Félix Henry, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 671 days.

(21) Appl. No.: 10/701,018

(22) Filed: Nov. 5, 2003

(65) Prior Publication Data

US 2004/0120590 A1 Jun. 24, 2004

(30) Foreign Application Priority Data

| Nov. 5, 2002 | (FR) | ................... 02 13818 |
| Nov. 5, 2002 | (FR) | ................... 02 13820 |
| Nov. 5, 2002 | (FR) | ................... 02 13823 |

(51) Int. Cl.
*G06K 9/36* (2006.01)
*G06K 9/46* (2006.01)

(52) U.S. Cl. ....................... 382/248; 382/239

(58) Field of Classification Search .............. None
See application file for complete search history.

(56) References Cited

U.S. PATENT DOCUMENTS

| 5,392,036 | A | | 2/1995 | Klein ..................... 341/51 |
| 5,412,741 | A | * | 5/1995 | Shapiro ................... 382/232 |
| 5,729,484 | A | | 3/1998 | Mack et al. .............. 364/725 |
| 5,729,691 | A | * | 3/1998 | Agarwal .................. 709/247 |
| 5,748,786 | A | | 5/1998 | Zandi et al. .............. 382/240 |
| 5,978,517 | A | | 11/1999 | Henry et al. .............. 382/253 |
| 5,995,027 | A | | 11/1999 | Henry .................... 341/50 |
| 6,031,939 | A | * | 2/2000 | Gilbert et al. ............. 382/239 |
| 6,215,422 | B1 | | 4/2001 | Henry et al. .............. 341/51 |
| 6,263,109 | B1 | * | 7/2001 | Ordentlich et al. ......... 382/232 |
| 6,333,705 | B1 | | 12/2001 | Amonou et al. ........... 341/107 |
| 6,445,312 | B1 | * | 9/2002 | Nguyen .................. 341/50 |
| 6,498,866 | B2 | | 12/2002 | Charrier et al. ............ 382/248 |
| 6,501,860 | B1 | | 12/2002 | Charrier et al. ............ 382/240 |

(Continued)

FOREIGN PATENT DOCUMENTS

FR  2 829 858 A1  3/2003

(Continued)

OTHER PUBLICATIONS

Z. Ji et al., "Block Permutation Coding Of Images Using Cosine Transform", IEEE Transactions On Communications, IEEE Inc., New York, US, vol. 43, No. 11, Nov. 1, 1995, pp. 2833-2846.

(Continued)

*Primary Examiner*—Matthew C Bella
*Assistant Examiner*—Yuzhen Ge
(74) *Attorney, Agent, or Firm*—Fitzpatrick, Cella, Harper & Scinto

(57) ABSTRACT

A method of encoding a set of data representing physical quantities includes forming a path between the samples of the set, the path passing a maximum of once via each sample location. For two given successive sample locations of the path, the method includes the step of forming a vector between the two sample locations, only taking into account the intermediate sample locations not already encoded by a vector.

19 Claims, 26 Drawing Sheets

U.S. PATENT DOCUMENTS

| | | | |
|---|---|---|---|
| 6,631,213 B1 | 10/2003 | Amonou et al. | 382/232 |
| 2002/0015530 A1 | 2/2002 | Henry et al. | 382/233 |
| 2002/0054644 A1 | 5/2002 | Henry et al. | 375/240.27 |
| 2003/0063804 A1 | 4/2003 | Henry | 382/232 |
| 2003/0154173 A1 | 8/2003 | Henry | 705/400 |

FOREIGN PATENT DOCUMENTS

| | | |
|---|---|---|
| FR | 2 831 729 A1 | 5/2003 |

OTHER PUBLICATIONS

S. Simon, "Generalized Run-Length Coding For SNR-Scalable Image Compression", Signal Processing: Theories And Applications, Proceedings Of Eusipco, Sep. 13, 1994, pp. 560-563.

N. Nill, "A Visual Model Weighted Cosine Transform For Image Compression And Quality Assessment" IEEE Transactions On Communications, IEEE Inc., New York, US, vol. COM-33, No. 6, Jun. 1985, pp. 551-557.

V.E. Neagoe, "Predictive Ordering And Linear Approximation For Image Data Compression", IEEE Transactions On Communications, IEEE Inc., New York, US, vol. 36, No. 10, Oct. 10, 1988, pp. 1179-1182.

K. Ramchandran et al., "Rate-Distortion Optimal Fast Thresholding With Complete JPEG/MPEG Decoder Compatibility", IEEE Transactions On Image Processing, IEEE Inc., New York, US, vol. 3, No. 5, Sep. 1, 1994, pp. 700-704.

F. Hartung et al., "Improved Encoding Of DCT Coefficients For Low Bit-rate Video Coding Using Multiple VLC Tables", Image processing, 1999, Proceedings 1999 International Conference On Kobe, Japan Oct. 24-28, 1999, Piscataway, NJ, USA, Oct. 24, 1999, pp. 51-55.

M. Rabbani et al., "An Overview Of The JPEG 2000 Still Image Compression Standard", Signal Processing, Image Communication, Elsevier Science Publishers, Amsterdam, NL, vol. 17, No. 1, Jan. 2002, pp. 3-48.

\* cited by examiner

DATA ENCODING WITH AN AMPLITUDE MODEL AND PATH BETWEEN THE DATA AND CORRESPONDING DECODING

BACKGROUND OF THE INVENTION

1. Field of the Invention

The present invention generally relates to digital signal encoding and for this purpose provides a method and a device for encoding a digital signal.

The object of the encoding is to compress the signal, which makes it possible respectively to transmit the digital signal and to store it in memory while reducing the transmission time, or the transmission rate respectively, by reducing the space in memory that is used.

The invention is in the field of lossy compression of digital signals. The digital signals considered here are of any type, for example fixed images, video, sound, or computer data.

2. Related Art

In what follows, the encoding and decoding of a fixed image will more particularly be considered.

In this context, certain encoding modes use a path established between a set of digital samples. For example, French patent applications No. 01 06933, 01 12064 and 01 13922 concern such encoding modes.

For the encoding to be efficient, that is to say for it to have a good rate-distortion ratio, it is necessary to determine the path in an appropriate manner.

Techniques exist to determine a path between a set of samples. These techniques are known as techniques for solving the traveling salesman problem. A review of these techniques is for example set out in the work of Gerhard Reinelt entitled "The traveling salesman, computational solutions for TSP applications", Springer-Verlag, 1994.

Generally it is desired that the result of the encoding be as compact as possible. Thus, in the case of encoding using a path established between a set of digital samples, the path is described by the shortest possible path (traveling salesman problem). The shorter the displacement vectors linking each point of the path, the more compact will be the result of their encoding.

SUMMARY OF THE INVENTION

In a first aspect, the present invention provides a method and a device for determining a path between samples of a signal which make it possible to obtain a description of that path which is still more compact than with the known methods.

To that end, the invention provides a method of encoding a set of data representing physical quantities, the encoding comprising forming a path between the samples of the set, the path passing a maximum of once via each sample location, characterized in that it comprises, for two given successive sample locations of the path, the step of:

forming a vector between the two sample locations, only taking into account the intermediate sample locations not already encoded by a vector.

The invention enables a description of that path to be obtained which is even more compact than with the known methods. This is because the vectors formed according to the invention are shorter than according to the prior art.

According to a preferred feature, the set of data being bidimensional, the method comprises the prior transformation of the set of data into a second set of mono-dimensional data.

According to an alternative preferred feature, the set of data being bidimensional, a vector is decomposed into two vectors and one of them is formed only taking into account the intermediate sample locations not already encoded by a vector.

According to a preferred feature, forming a vector between the two sample locations comprises:

testing all the intermediate locations between the two sample locations to determine whether they have already been encoded, reducing the length of the vector as a function of the number of locations already encoded.

Thus, the information already encoded is exploited in order to reduce the quantity of information necessary to form a path.

According to a preferred feature, the set of data is a block formed in an initial set of data.

According to a preferred feature, the set of data is the result of a DCT transformation of an initial set of data.

The invention also relates to a method of decoding a set of data encoded by the method presented above, comprising a step of decoding the path, characterized in that the decoding of the path comprises the step of:

deducing the location of a coefficient of the path as a function of the preceding location, the vector between the two locations, and the locations already decoded.

In a complementary manner, the invention relates to a device for encoding a set of data representing physical quantities, comprising means for forming a path between the samples of the set, the path passing a maximum of once via each location, characterized in that it comprises:

means for forming a vector between two given successive locations of the path, only taking into account the intermediate samples not already encoded by a vector.

The encoding device comprising means for implementing the encoding features presented above.

The invention also concerns a decoding device comprising means for implementing the decoding features presented above.

The encoding device and the decoding method and device have similar advantages to those already presented.

The techniques for solving the traveling salesman problem use evolutionary calculation, which provides an optimum solution to the problem but requires a long calculation time.

In a second aspect, the present invention aims to remedy the drawbacks of the prior art, by providing a method and a device for encoding digital data by which a path is determined more rapidly than with the prior art.

To that end, the invention provides a method of encoding digital samples of a set of data representing physical quantities, the encoding including the determination of an amplitude model and of a path between the samples of the set, characterized in that it comprises the steps of:

determining a number of samples to encode, constructing a list comprising the determined number of samples, classified by decreasing amplitude.

The invention enables the path between the samples to be determined more rapidly than according to the prior art. The deterioration of the compression performances (rate and distortion) is low and generally negligible.

According to a first preferred variant, the method comprises the steps of:

determining an initial list of samples, calculating an encoding cost as a function of the list of samples, modifying the list of samples, the steps of calculating and modifying being reiterated to find a minimum encoding cost.

Thus, according to this variant, a list of samples is determined.

According to a preferred feature, the method further comprises the step of encoding the set of data on the basis of the list of samples which provides the minimum encoding cost.

The list determined according to the invention is thus used to encode the data.

According to a preferred feature, the initial list of samples comprises all the samples of the set of data.

According to a preferred feature, the modification of the list of samples comprises the withdrawal of the sample of least amplitude.

Thus, the lists envisaged will have a number of samples that decreases as the iterations progress.

According to preferred features which may be combined, the encoding cost comprises the rate of the encoded data and the encoding cost comprises the distortion of the encoded data. The rate and distortion are commonly taken into account on compression of data. Among the lists envisaged the one which has the least encoding cost is selected to encode the data. The determination of that list is rapid, and its construction gives it low encoding cost.

According to a second variant, the invention relates to a method as presented earlier, comprising an initialization of an evolutionary algorithm according to which a population of lists of samples is determined, the population comprising a predetermined number of lists, characterized in that the determination of the population comprises the steps of:

determining a first list of samples classified by decreasing amplitude, modifying the first list by withdrawal of a predetermined number of samples of lowest amplitude, to form a second list, the steps of determining and modifying being reiterated by taking the second list of an iteration as the first list for the following iteration, provided that the predetermined number of lists has not been reached and that the second list has a non-zero number of samples.

According to this variant, it is the initialization of the evolutionary calculation which is simplified and rendered more rapid to execute. Furthermore, the lists created according to the invention are generally better than lists picked randomly, which means that convergence of the evolutionary calculation is favored.

According to a preferred feature, the population is completed by lists picked randomly, if the second list formed has a zero number of samples before the predetermined number of lists has been reached.

According to a preferred feature, the set of data is a block of samples formed in a larger set of data.

According to a preferred feature, the data are a digital image.

In a complementary manner the invention relates to a device for encoding digital samples of a set of data representing physical quantities, comprising means for determining an amplitude model and a path between the samples of the set, characterized in that it comprises:

means for determining a number of samples to encode, means for constructing a list comprising the determined number of samples, classified by decreasing amplitude.

The device according to the invention comprises means for implementing the features presented above and has similar advantages to those presented above.

Furthermore, it is desirable for the calculations to determine the amplitude model to be neither too long nor too complex.

In a third aspect, the object of the present invention is to provide a method and device according to which the encoding of the data by an amplitude model and a path between the data is simplified.

To that end, the invention provides a method of encoding a set of data representing physical quantities, the set of data comprising coefficients, the method comprising determining an amplitude model of the coefficients and a path between the coefficients, characterized in that it comprises the prior step of:

putting the coefficients in order as a function of their respective locations in the set of data.

The invention makes it possible to encode the data using an amplitude model and a path formed between the data more rapidly than according to the prior art.

According to a preferred feature, the prior step of putting the coefficients in order comprises putting them in order following a zig-zag path. This type of path is simple to implement.

According to a preferred feature, the ordered coefficients are arranged in a one-dimensional vector. The path between the coefficients will then be formed in that vector.

According to an alternative feature, the prior step of putting the coefficients in order comprises forming blocks of predetermined size in the set of data and putting the blocks formed in order according to a predetermined order.

According to a preferred feature, the ordered coefficients are arranged in a three-dimensional table. According to this variant, the path between the coefficients is then formed in this table.

According to a preferred feature, determining the amplitude model comprises classifying the coefficients by decreasing amplitude. This classification is simplified by the prior putting in order of the coefficients according to the invention.

According to a preferred feature, the set of data is the result of a discrete cosine transformation of an initial set of data.

According to an alternative feature, the set of data is the result of a discrete wavelet transformation of an initial set of data.

The advantage of these transformations is to concentrate the most significant coefficients in the same region of the signal.

The invention also relates to a method of decoding a set of data representing physical quantities encoded by the method presented earlier, comprising the decoding of an amplitude model of the coefficients and of a path between the coefficients, so as to form a first set of decoded coefficients, characterized in that it comprises the step of:

putting the decoded coefficients in order as a function of their respective locations in the first set of decoded coefficients so as to form a second decoded set.

According to a preferred feature, the first set of decoded coefficients is a one-dimensional vector and the decoded coefficients are taken from first to last and are arranged in a two-dimensional table following a zig-zag path.

According to an alternative feature, the first set of decoded coefficients is a three-dimensional table, and the decoded coefficients are arranged in a two two-dimensional table, the levels of the three-dimensional table being arranged in lexicographical order.

In a complementary manner, the invention relates to a device for encoding a set of data representing physical quantities, the set of data comprising coefficients, the device comprising means for determining an amplitude model of the coefficients and a path between the coefficients, characterized in that it comprises:

prior means for putting the coefficients in order as a function of their respective locations in the set of data.

The invention also relates to a device for decoding a set of data representing physical quantities encoded by the device presented earlier, comprising means for the decoding of an amplitude model of the coefficients and of a path between the coefficients, so as to form a first set of decoded coefficients, characterized in that it comprises:

means for putting the decoded coefficients in order as a function of their respective locations in the first set of decoded coefficients so as to form a second decoded set.

The devices according to the invention comprise means for implementing the features already set out.

The encoding device and the decoding method and device have similar advantages to those already presented.

The invention also relates to a digital apparatus including the device according to the invention or means for implementing the method according to the invention. This digital apparatus is for example a digital camera, a digital camcorder, a scanner, a printer, a photocopier, or a fax machine. The advantages of the device and of the digital apparatus are identical to those already set out.

The invention also relates to an information storage means, which can be read by a computer or microprocessor, integrated or not into the device, and possibly removable, storing a program implementing the method according to the invention.

The invention also relates to a computer program readable by a microprocessor and comprising one or more sequences of instructions capable of implementing the methods according to the invention.

BRIEF DESCRIPTION OF THE DRAWINGS

The characteristics and advantages of the present invention will appear more clearly from a reading of three preferred embodiments illustrated by the accompanying drawings, in which.

DETAILED DESCRIPTION OF THE PREFERRED EMBODIMENTS

Figure 1:
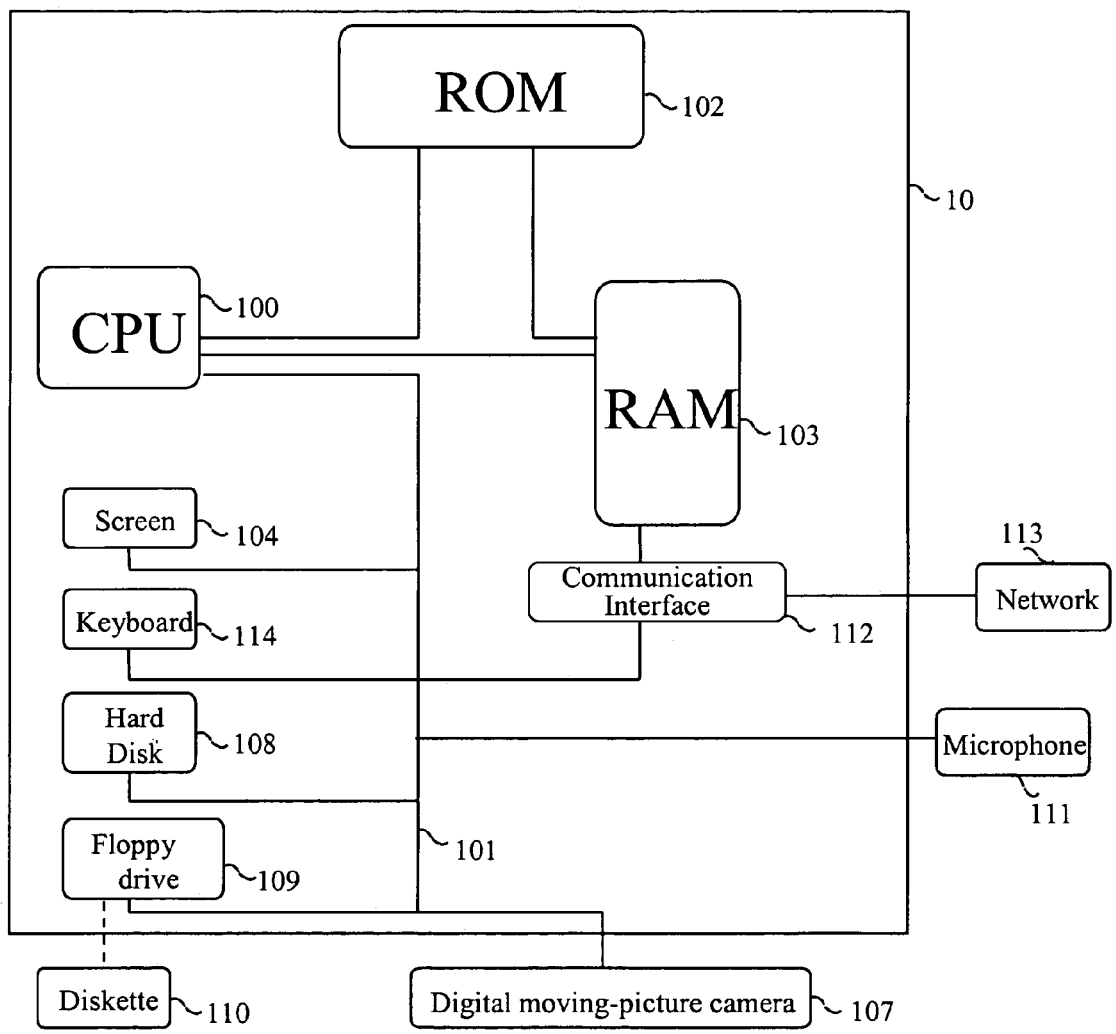
FIG. 1 is an embodiment of a device implementing the invention.

According to the chosen embodiment shown in FIG. 1, a device implementing the invention is for example a microcomputer 10 connected to different peripherals, for example a digital moving picture camera 107 (or a scanner, or any means of acquiring or storing an image) connected to a graphics card and supplying information to be processed according to the invention.

The device 10 comprises a communication interface 112 connected to a network 113 able to transmit digital data to be processed or conversely to transmit data processed by the device. The device 10 also comprises a storage means 108 such as a hard disk. It also comprises a drive 109 for a disk 110. This disk 110 may for example be a diskette, a CD-ROM, or a DVD-ROM. The disk 110 like the hard disk 108 can contain data processed according to the invention as well as the program or programs implementing the invention which, once read by the device 10, will be stored on the hard disk 108. According to a variant, the program enabling the device to implement the invention can be stored in read-only memory 102 (referred to as ROM in the drawing). In a second variant, the program can be received in order to be stored in an identical fashion to that described previously via the communication network 113.

The device 10 is connected to a microphone 111. The data to be processed according to the invention will in this case be audio signal.

This same device has a screen 104 for displaying the data to be processed or serving as an interface with the user, who can thus parameterize certain processing modes, using the keyboard 114 or any other means (a mouse for example).

The central processing unit 100 (referred to as CPU in the drawing) executes the instructions relating to the implementation of the invention, which are stored in the read-only memory 102 or in the other storage means. On powering up, the processing programs stored in a non-volatile memory, for example the ROM 102, are transferred into the random access memory RAM 103, which will then contain the executable code of the invention, as well as registers for storing the variables necessary for implementing the invention.

In more general terms, an information storage means, which can be read by a computer or microprocessor, integrated or not into the device, and which may possibly be removable, stores a program implementing the method according to the invention.

The communication bus 101 affords communication between the different elements included in the microcomputer 10 or connected to it. The representation of the bus 101 is not limiting and, in particular, the central processing unit 100 is able to communicate instructions to any component of the microcomputer 10 directly or by means of another element of the microcomputer 10.

FIGS. 2 to 17 concern the first embodiment of the invention.

Figure 2:
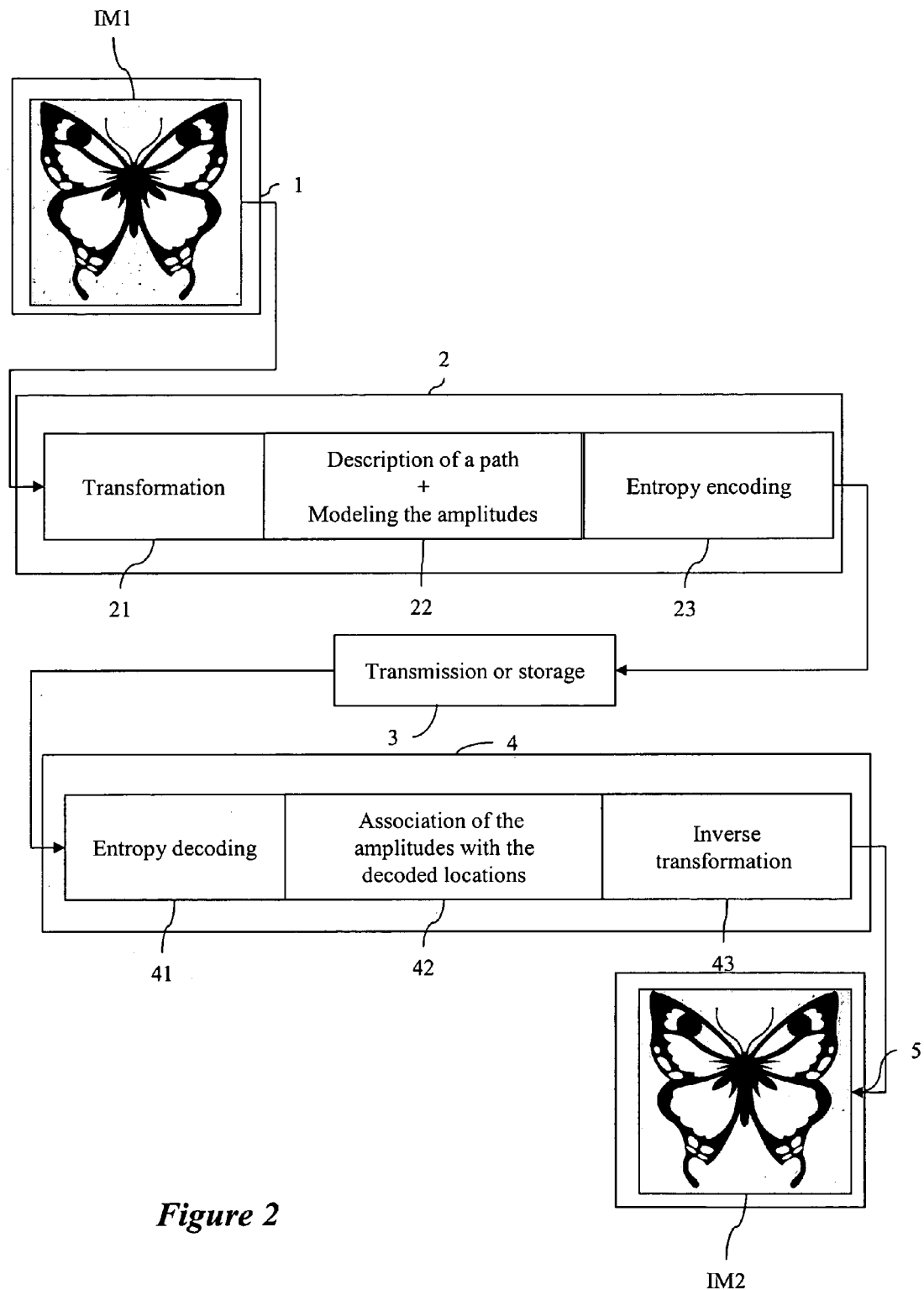
FIG. 2 represents an encoding device and a corresponding decoding device, according to a first embodiment of the invention.

With reference to FIG. 2, the first embodiment of an encoding device according to the invention is adapted to encode a digital signal with the object of compressing it. The encoding device is integrated into an apparatus, which is for example a digital camera, a digital camcorder, a scanner, a printer, a photocopier, a fax machine, a database management system, or a computer.

An image source 1 supplies a digital image IM1 to the encoding device 2, of which the operation will be detailed below. The encoding includes determining a path between the samples of the set.

The encoding device comprises a transformation circuit 21 connected to a circuit 22 for calculating an amplitude model and path. The transformation circuit 21 supplies a transformed image to circuit 22.

The circuit 22 is connected to an encoding circuit 23 which performs an entropy encoding of the previously determined path.

The operation of the encoding device will be detailed hereinafter. The determination of a path between the data to encode, which the present invention relates to, will be more particularly detailed.

The encoding device provides a file containing data representing the compressed image to means 3 for transmission and/or storage. These means are conventional and will not be described here.

The means 3 are connected to a decoding device 4 whose operation will be detailed below.

The decoding device comprises a circuit 41 for entropy decoding of the data which it receives.

Circuit 41 is connected to a circuit 42 for decoding the amplitude model and the path, which associates an amplitude with each decoded location.

Circuit 42 is connected to a circuit 43 for inverse transformation which supplies a decoded image IM2 to a device 5 for viewing the image.

It should be noted that the encoding device and decoding device may be incorporated into the same apparatus, for example the computer 10 of FIG. 1.

Figure 3:
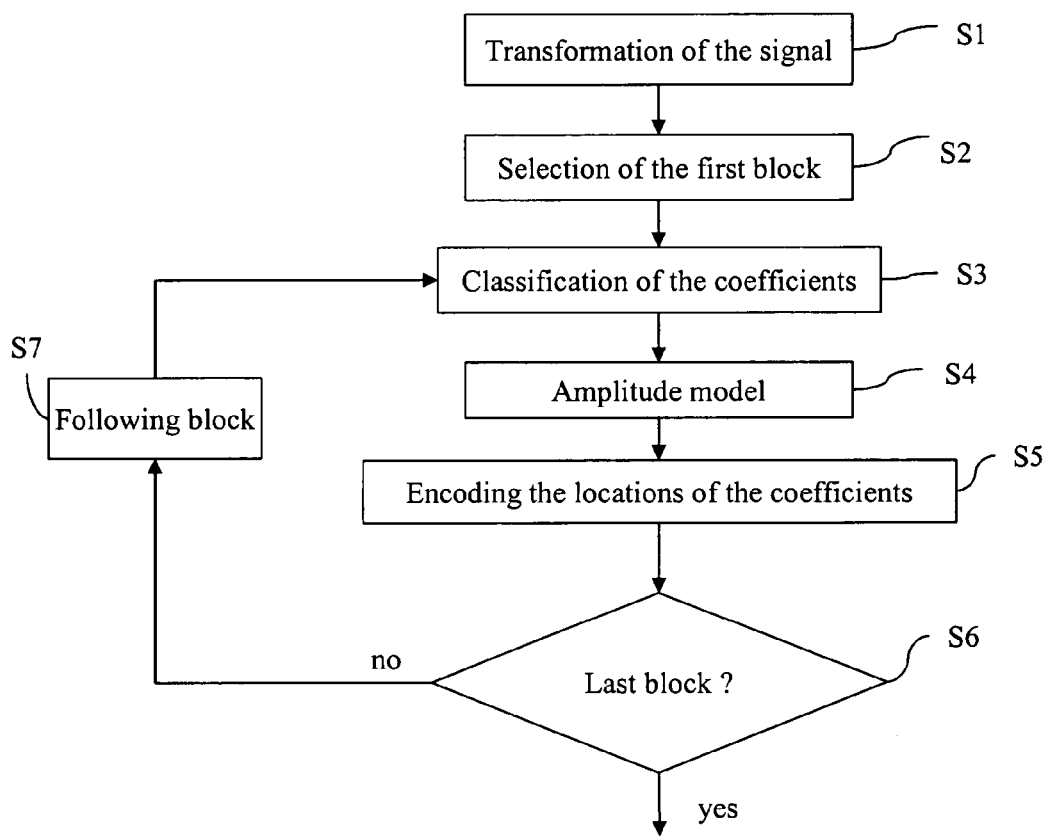
FIG. 3 represents an embodiment of an encoding method according to the first embodiment of the invention.

FIG. 3 represents an embodiment of a method of encoding an image, according to the first embodiment of the invention. This method is implemented in the encoding device and comprises the steps S1 to S7.

The method generally comprises a transformation of the signal to be encoded, then the determination of an amplitude model of the coefficients output from the transformation. The locations of these coefficients are next encoded according to a method using a path established between the coefficients.

Such an encoding method is described for example in French patent application No. 01 06933.

The method is carried out in the form of an algorithm which can be stored in whole or in part in any means of information storage capable of cooperating with the microprocessor. This storage means is readable by a computer or by a microprocessor. The storage means is integrated or not into the device, and may be removable. For example, it may comprise a magnetic tape, a diskette or a CD-ROM (fixed memory compact disk).

Step S1 is a linear or non-linear transformation of a digital image IM1 to be processed according to the invention.

In the preferred embodiment of the invention, the image is divided into blocks and then a discrete cosine transformation (DCT) is applied to each block, such as that applied under the JPEG standard.

In variant form, another transformation is used, for example a discrete wavelet transformation, as in the JPEG2000 standard.

The following processing is performed block by block. In variant form, the processing may be applied globally to the whole image.

The following step S2 is an initialization at which a first block is considered.

The following step S3 consists of classifying the coefficients of the current block according to decreasing amplitude. This results in a list P of coefficients.

The following step S4 is the determination of an amplitude model. For this, a function for approximating the series of the classified coefficients is determined. This function is for example a decreasing exponential defined by a set of parameters which are determined by regression. French patent application No. 01 06933 describes this step in detail, as follows.

The method will choose, from the series of P coefficients arranged from the greatest to the least and named by the series $x_1, x_2, x_3, \ldots, x_P$, a set A comprising a finite number of R parameters $a_1, a_2, \ldots, B_R$. For example, a decreasing exponential family could be chosen, written $f_A(x) = a_1 \cdot \exp(a_3 \cdot x + a_4) \, a_2$.

The method will then determine among a family of real functions that which reproduces as accurately as possible the evolution of the values of the $x_i$ as a function of their rank i.

At these steps, the parameters $a_1, a_2, a_3,$ and $a_4$ will be determined such that the function $f_A$ is the closest possible to the points $(1, x_1), (2, x_2), \ldots, (P, x_P)$. This typical problem is called function regression. Numerous techniques exist for finding the best set of parameters. For example minimization of the root mean square error RMSE could be sought, equal to $$RMSE = \frac{1}{p}\sqrt{\sum_{i=1}^{P}(x_i - f_A(i))^2}.$$

To achieve this, it could be chosen to quantize each parameter $a_i$ into a finite number of possible values. There are then a finite number of different values of parameters of A. The RMSE value is then calculated for each set of parameters and is then stored with the value of the parameters associated. When all the parameters have been incremented, the set which minimizes RMSE from among the stored parameters will be chosen.

Figure 4:
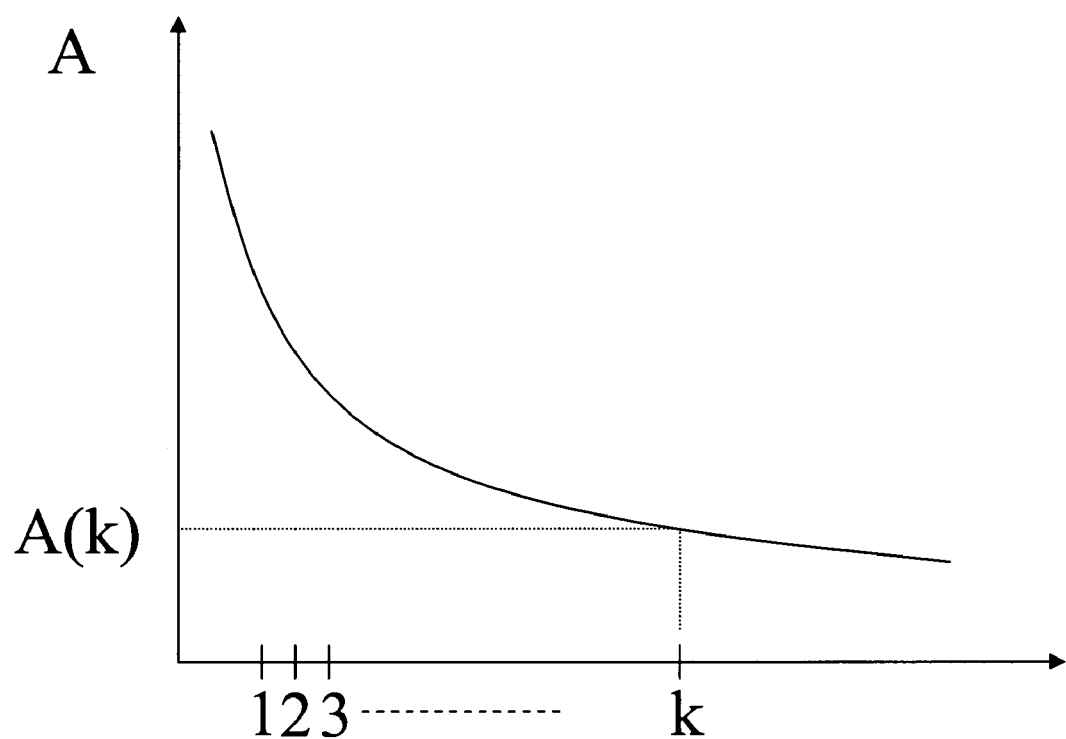
FIG. 4 represents an amplitude model used according to the present invention.

FIG. 4 represents an example of an amplitude model A. A value A(k) provided by the amplitude model corresponds to each integer value k along the x-axis. The value A(k) is an approximation of the amplitude of the $k^{th}$ coefficient classified in decreasing order.

The following step S5 is the encoding of the locations of the coefficients of the current block.

Two variants of this step are detailed below.

The following step S6 is a test to determine whether the current block is the last block of the image to encode.

If the response is negative, that step is followed by the step S7 at which a following block is considered. Step S7 is followed by the previously described step S3.

If the response is positive at step S6, then the encoding of the image is terminated.

Figure 5:
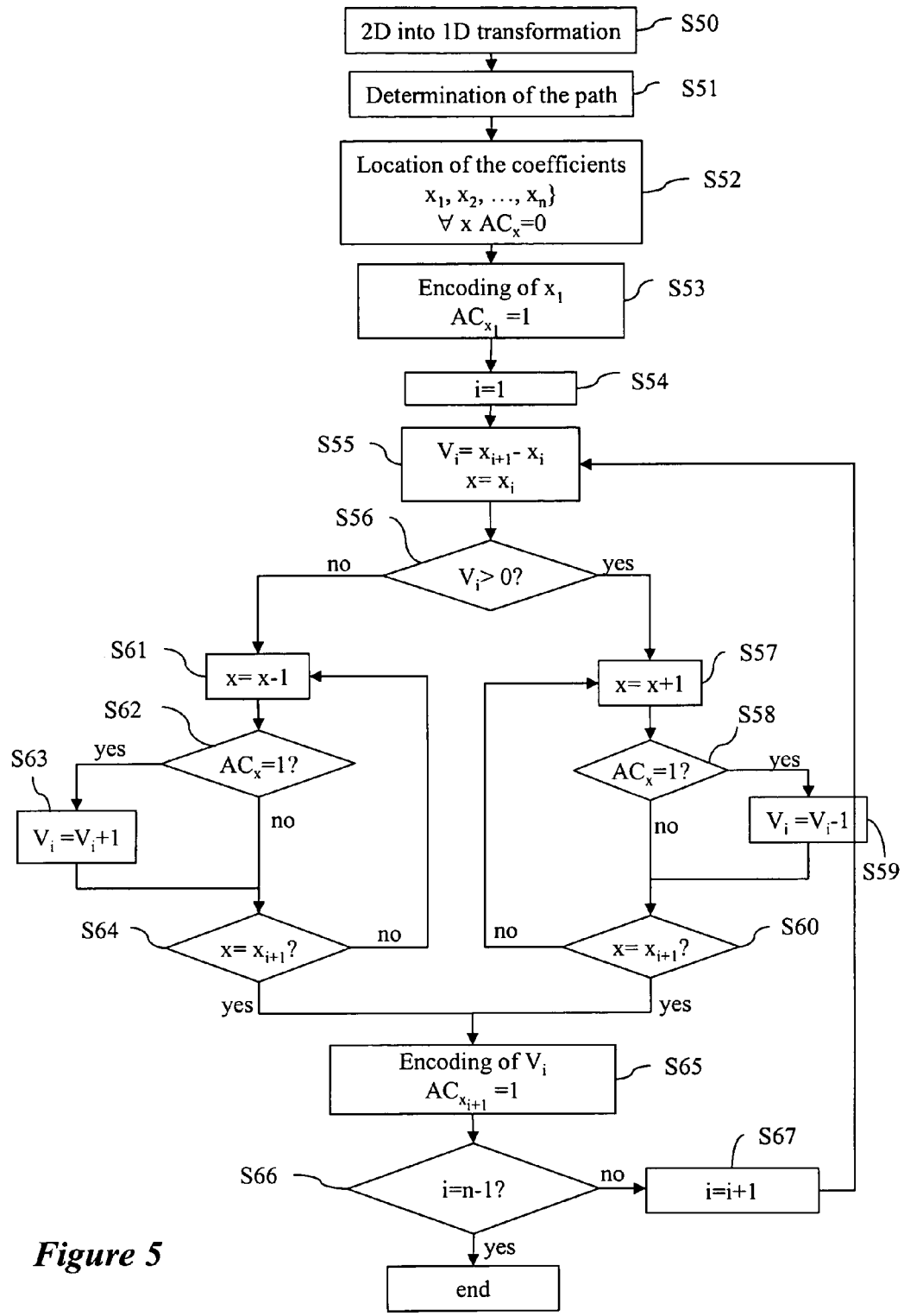
FIG. 5 represents a first variant of encoding locations of coefficients implemented according to the first embodiment of the invention.

The first variant of step S5 of encoding the locations of the coefficients of the current block is detailed in FIG. 5 in the form of an algorithm comprising steps S50 to S67.

Figure 6:
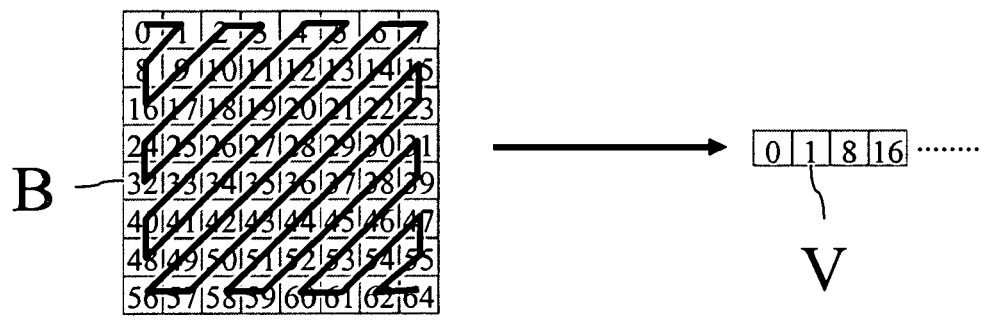
FIG. 6 represents an example of a signal to be processed according to the first embodiment of the invention.

Step S50 is a transformation of the bidimensional signal into a mono-dimensional signal. For this, a zig-zag path is followed through the block B. As represented in FIG. 6, in the block B of 8×8 coefficients, the diagonals of the coefficients oriented from bottom left to top right are considered. The path begins at the top left. The path passes through the diagonals either from bottom left to top right, or in the opposite sense. For a given diagonal, the direction of the path is the direction opposite to that of the preceding diagonal.

Following this path direction causes the coefficients to be arranged in a mono-dimensional vector V containing 64 coefficients.

Figure 7:
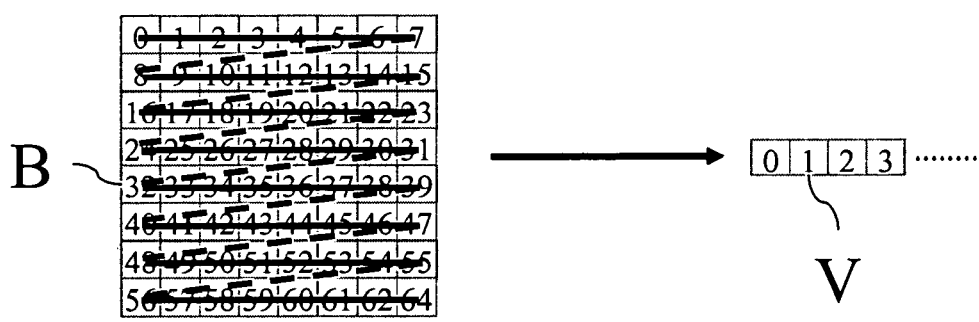
FIG. 7 represents an example of a signal to be processed according to the first embodiment of the invention.

In variant form, as represented in FIG. 7, block B is passed through line by line, from left to right and from top to bottom, in order to form a mono-dimensional signal.

The following step S51 is the determination of a path in the vector V.

A path is determined by an initial coefficient and the list of the vectors joining the other coefficients. Each coefficient of the path different from the initial coefficient is represented by a vector describing its location with respect to the preceding coefficient in the path. It should be noted that the path does not necessarily include all the coefficients of the current vector. This is because it is possible to encode only part of the coefficients and to set the other coefficients to the value zero at the time of later encoding.

Figure 8:
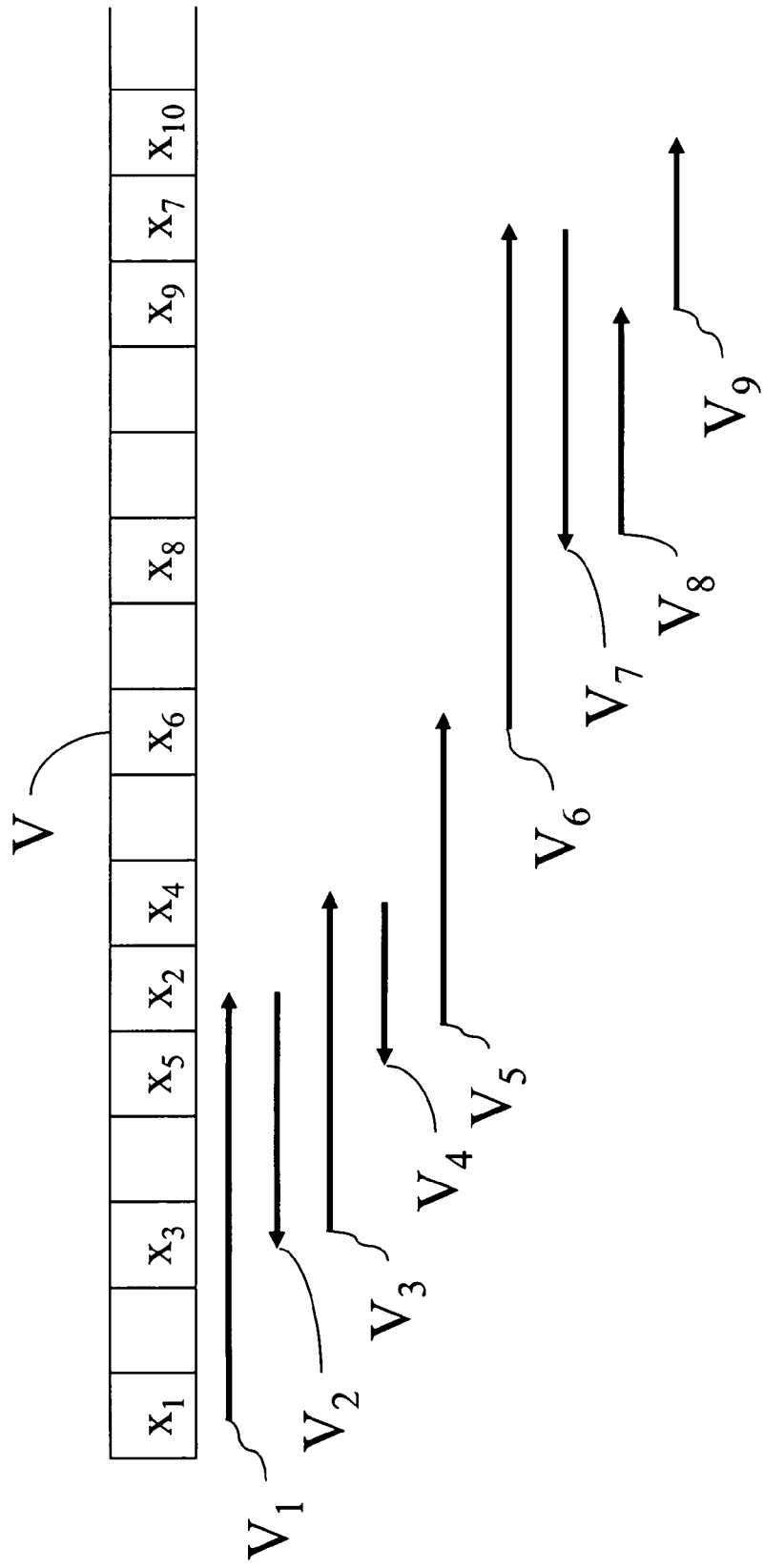
FIG. 8 represents an example of a path to encode according to the first embodiment of the invention.

For example, FIG. 8 represents a path comprising ten coefficients of which the locations $x_1$ to $x_{10}$ are connected by nine vectors $V_1$ to $V_9$.

In what follows, the locations $\{x_1, x_2, \ldots, x_n\}$ of coefficients in the vector V are considered, where n is an integer equal to the number of coefficients of the path.

The following step S52 is an initialization at which a binary encoding parameter $AC_x$ is associated with each of the locations x of the vector V. All the encoding parameters $AC_x$ are set to the value zero at step S52.

For the following processing, the encoding parameter $AC_x$ has the value zero if the location x has not yet been encoded, and has the value one once the location x has been encoded.

The following step S53 is an encoding of the first location $x_1$ of the path. The parameter $AC_{x1}$ which is associated with it is set to the value one.

The following step S54 is an initialization at which a parameter i is initialized to the value one.

At the following step S55, the vector $V_i=x_{i+1}-x_i$ is considered. A location parameter x is set to the value $x_i$.

The following step S56 is a test to determine if the current vector $V_i$ is oriented in one direction or the other. For example an axis of coordinates of which the origin is at $x_1$ is considered. Along that axis, the vector $V_1$ (FIG. 8) is positive whereas the vector $V_2$ is negative.

When the current vector $V_i$ is positive, step S56 is followed by step S57 at which the location parameter x is incremented by one unit, in order to consider the location immediately to the right of the current location.

The following step S58 is a test to determine whether the encoding parameter of location x has the value one, that is to say whether location x has already been encoded.

If the response is positive, then step S58 is followed by step S59 at which the value of the current vector $V_i$ is decremented by one unit, so as to "skip" the location already encoded.

If the response is negative at step S58, this step is followed by the step S60. In the same way, step S59 is followed by the step S60.

Step S60 is a test to determine whether the current value of the location parameter x is equal to $x_{i+1}$.

If the response is negative, that means that all the locations between the positions $x_i$ and $x_{i+1}$ have not yet been considered. Step S60 is then followed by the previously described step S57.

If the response is positive at step S60, that means that all the locations between the positions $x_i$ and $x_{i+1}$ have been tested in order to know whether they have already been encoded or not. The length of vector $V_i$ has been reduced by the number of locations met that were already encoded.

When the current vector $V_i$ is negative, step S56 is followed by step S61 at which the location parameter x is decremented by one unit, in order to consider the location immediately to the left of the current location.

The following step S62 is a test to determine whether the encoding parameter of location x has the value one, that is to say whether location x has already been encoded.

If the response is positive, then step S62 is followed by step S63 at which the value of the current vector $V_1$ is incremented by one unit, so as to "skip" the location already encoded.

If the response is negative at step S62, this step is followed by the step S64. In the same way, step S63 is followed by the step S64.

Step S64 is a test to determine whether the current value of the location parameter x is equal to $x_{i+1}$.

If the response is negative, that means that all the locations between the positions $x_i$ and $x_{i+1}$ have not yet been considered. Step S64 is then followed by the previously described step S61.

If the response is positive at step S64, that means that all the locations between the positions $x_i$ and $x_{i+1}$ have been tested in order to know whether they have already been encoded or not. The length of vector $V_i$ has been reduced by the number of locations met that were already encoded.

Steps S60 and S64 are followed by the step S65 which is the entropy encoding of the current vector $V_i$.

The encoding parameter $AC_{xi+1}$ of the location $x_{i+1}$ is set to the value 1.

The following step S66 is a test to determine whether the parameter i has the value n−1, i.e. whether all the vectors to be encoded have been processed.

If the response is negative, then step S66 is followed by the step S67 at which the parameter i is incremented by one unit in order to consider a following vector. Step S67 is followed by the previously described step S55.

When the response is positive at step S66, the encoding of the path according to the invention is terminated.

Figure 9:
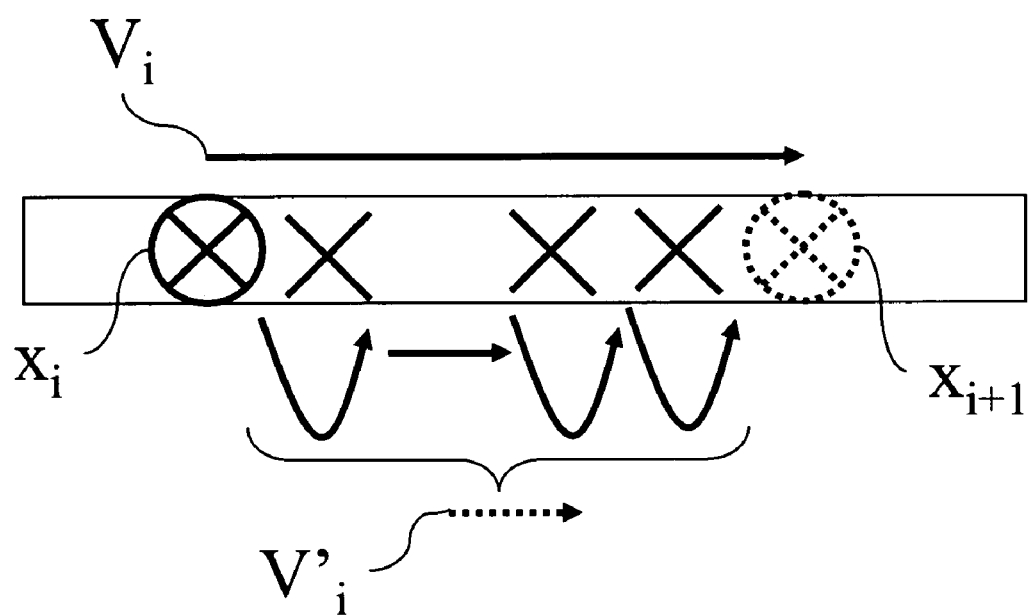
FIGS. 9 and 10 represent a vector reduction implemented according to the first embodiment of the invention.

FIG. 9 represents the application of the vector reduction according to the first embodiment of the invention.

The vector $V_i$ determined at step S55 has a length of five locations between the locations $x_i$ and $x_{i+1}$. Three of the locations between $x_i$ and $x_{i+1}$ have already been encoded and are represented by crosses.

The result of the processing of vector $V_i$ is to reduce the length of that vector by three, so as to skip the locations already encoded. The resulting vector $V'_i$ has a length of two locations corresponding to the intermediate location not yet encoded and to the location of $x_{i+1}$.

Figure 10:
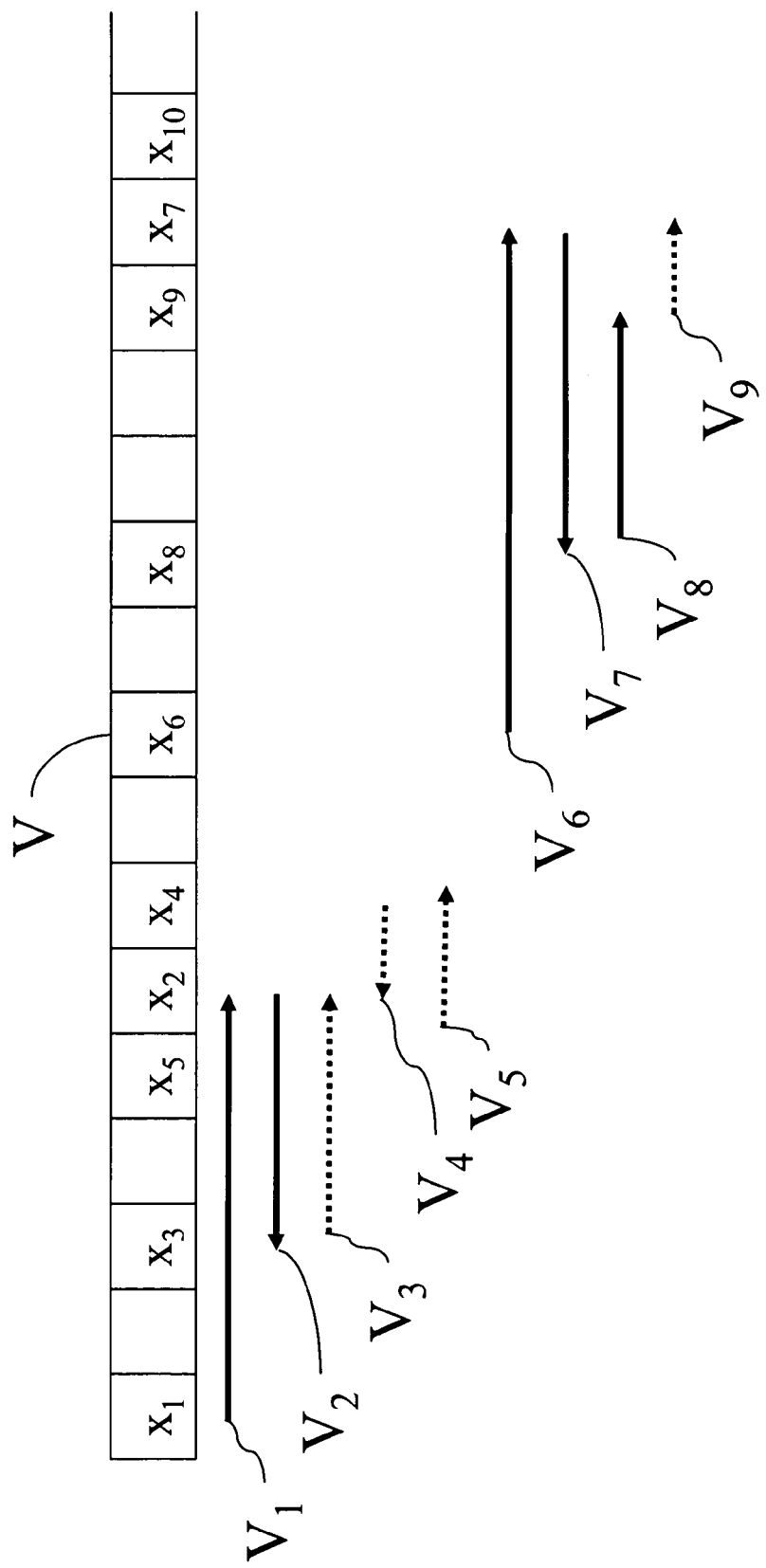

FIG. 10 represents the application of the vector reduction to the vectors of FIG. 8.

The total amplitude of the vectors is 33 before processing according to the invention. It is 28 by virtue of the invention.

The vectors are shorter, which reduces the information to be transmitted and which corresponds to an increase in compression.

Figure 11:
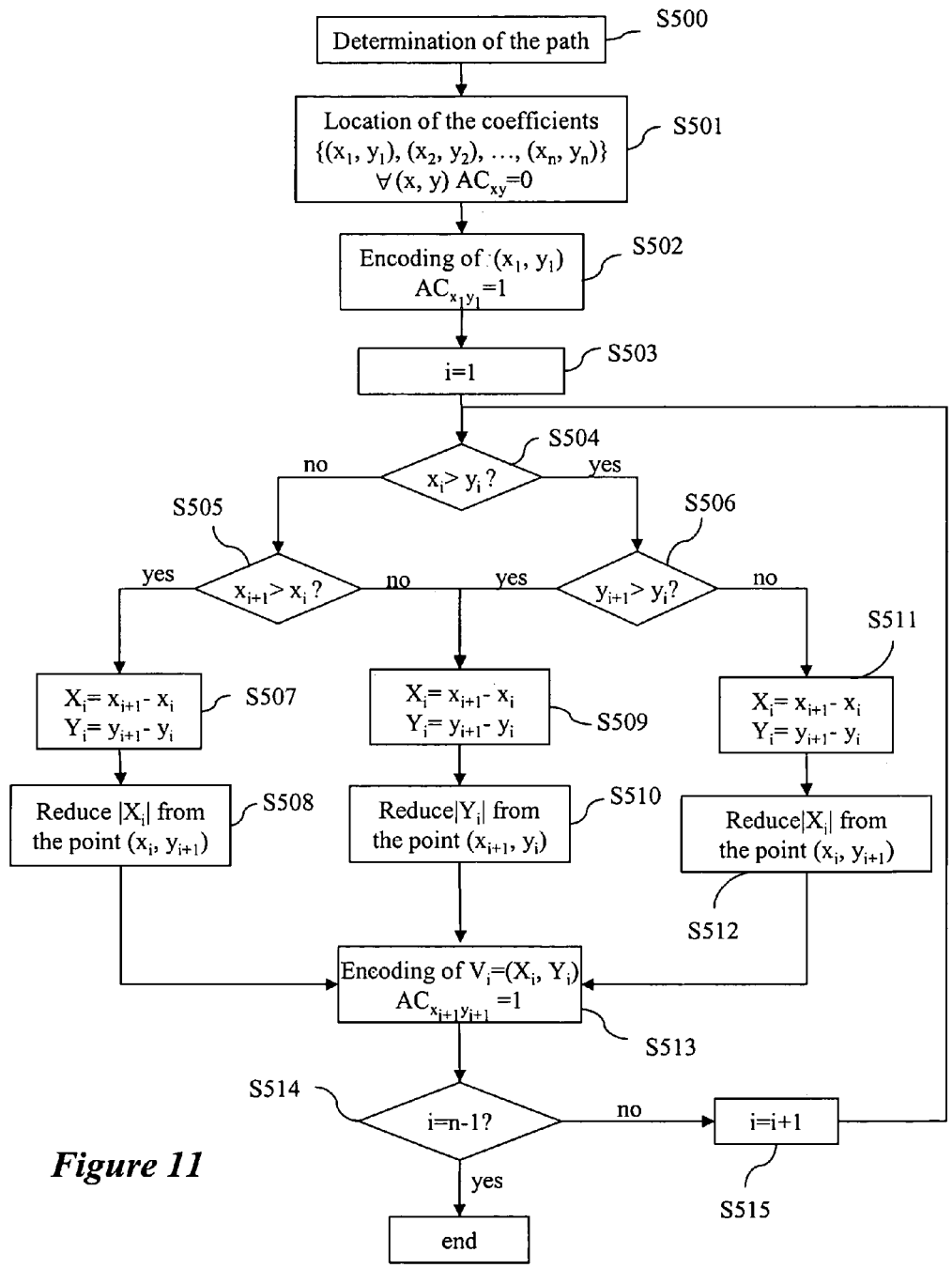
FIG. 11 represents a second variant of encoding locations of coefficients implemented according to the first embodiment of the invention.

The second variant of step S5 of encoding the locations of the coefficients of the current block is detailed in FIG. 11 in the form of an algorithm comprising steps S500 to S515.

Step S500 is the determination of a path in the current block.

In a similar manner to the first variant, a path is determined by an initial coefficient and the list of vectors joining the other coefficients. Each coefficient of the path different from the initial coefficient is represented by a vector describing its location with respect to the preceding coefficient in the path. It should be noted that the path does not necessarily include all the coefficients of the current block. This is because it is possible to encode only part of the coefficients and to set the other coefficients to the value zero at the time of later encoding.

Figure 12:
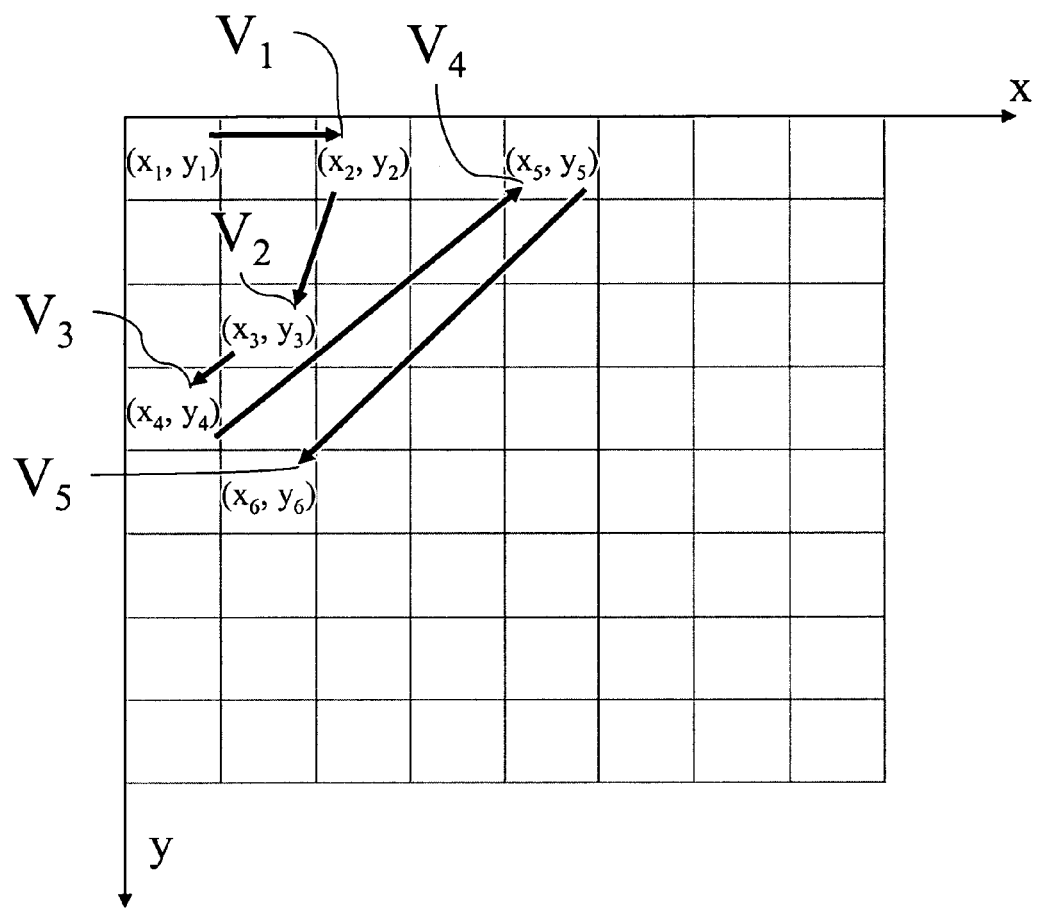
FIG. 12 represents an example of a path to encode according to the first embodiment of the invention.

For example, FIG. 12 represents a path comprising six coefficients of which the locations are connected by five vectors $V_1$ to $V_5$. The locations of the coefficients of the path are located by their coordinates $(x_i, y_i), (x_2, y_2), \ldots, (x_6, y_6)$ in a coordinate system of two dimensional space.

In what follows, the locations $\{(x_i, y_i), (x_2, y_2) \ldots, (x_n, y_n)\}$ of coefficients in the current block are considered, where n is an integer equal to the number of coefficients of the path.

The following step S501 is an initialization at which a binary encoding parameter $AC_{xy}$ is associated with each of the locations (x, y) of the current block. All the encoding parameters $AC_{xy}$ are set to the value zero at step S501.

For the following processing, the encoding parameter $AC_{xy}$ has the value zero if the location (x, y) has not yet been encoded, and has the value one once the location (x, y) has been encoded.

The following step S502 is an encoding of the first location $(x_i, y_i)$ of the path. The parameter $AC_{x1y1}$, which is associated with it is set to the value one.

The following step S503 is an initialization at which a parameter i is initialized to the value one.

The following step S504 is a test to determine whether the coordinate $x_i$ is greater than the coordinate $y_i$.

If the response is negative, step S504 is followed by the step S505 which is a test to determine whether the coordinate $x_{i+1}$ is greater than the coordinate $x_i$.

If the response is positive at step S504, then step S504 is followed by the step S506 which is a test to determine whether the coordinate $y_{i+1}$, is greater than the coordinate $y_i$.

When the response is positive at step S505, that step is followed by the step S507 at which the current vector $V_i$ is decomposed into two vectors $X_i$ and $Y_i$.

The vector $X_i$ is equal to: $x_{i+1}-x_i$ and the vector $Y_i$ is equal to: $y_{i+1}-y_i$.

The following step S508 is the reduction of the vector $X_i$. That reduction is similar to the reduction of a mono-dimensional vector described in the first variant. The mono-dimensional vector which is considered here is between the points $(x_i, y_{i+1})$ and $(x_{i+1}, y_{i+1})$.

When the response is negative at step S505, or when the response is positive at step S506, that step is followed by the step S509 at which the current vector $V_i$ is decomposed into two vectors $X_i$ and $Y_i$.

The vector $X_i$ is equal to: $x_{i+1}-x_i$ and the vector $Y_i$ is equal to: $y_{i+1}-y_i$.

The following step S510 is the reduction of the vector $Y_i$. That reduction is similar to the reduction of a mono-dimensional vector described in the first variant. The mono-dimensional vector which is considered here is between the points $(x_{i+1}, y_i)$ and $(x_{i+1}, y_{i+1})$.

When the response is positive at step S506, that step is followed by the step S511 at which the current vector $V_i$ is decomposed into two vectors $X_i$ and $Y_i$.

The vector $X_i$ is equal to: $x_{i+1}-x_i$ and the vector $Y_i$ is equal to: $y_{i+1}-y_i$.

The following step S512 is the reduction of the vector $X_i$. That reduction is similar to the reduction of a mono-dimensional vector described in the first variant. The mono-dimensional vector which is considered here is between the points $(x_i, y_{i+1})$ and $(x_{i+1}, y_{i+1})$.

Steps S508, S510, and S512 are followed by the step S513 which is the entropy encoding of the current vector $V_i$.

The encoding parameter $AC_{xi+1yi+1}$ of the location $(x_{i+1}, y_{i+1})$ is set to the value one.

The following step S514 is a test to determine whether the parameter i has the value n−1, i.e. whether all the vectors to be encoded have been processed.

If the response is negative, then step S514 is followed by the step S515 at which the parameter i is incremented by one unit in order to consider a following vector. Step S515 is followed by the previously described step S504.

When the response is positive at step S514, the encoding of the path according to the invention is terminated.

Figure 13:
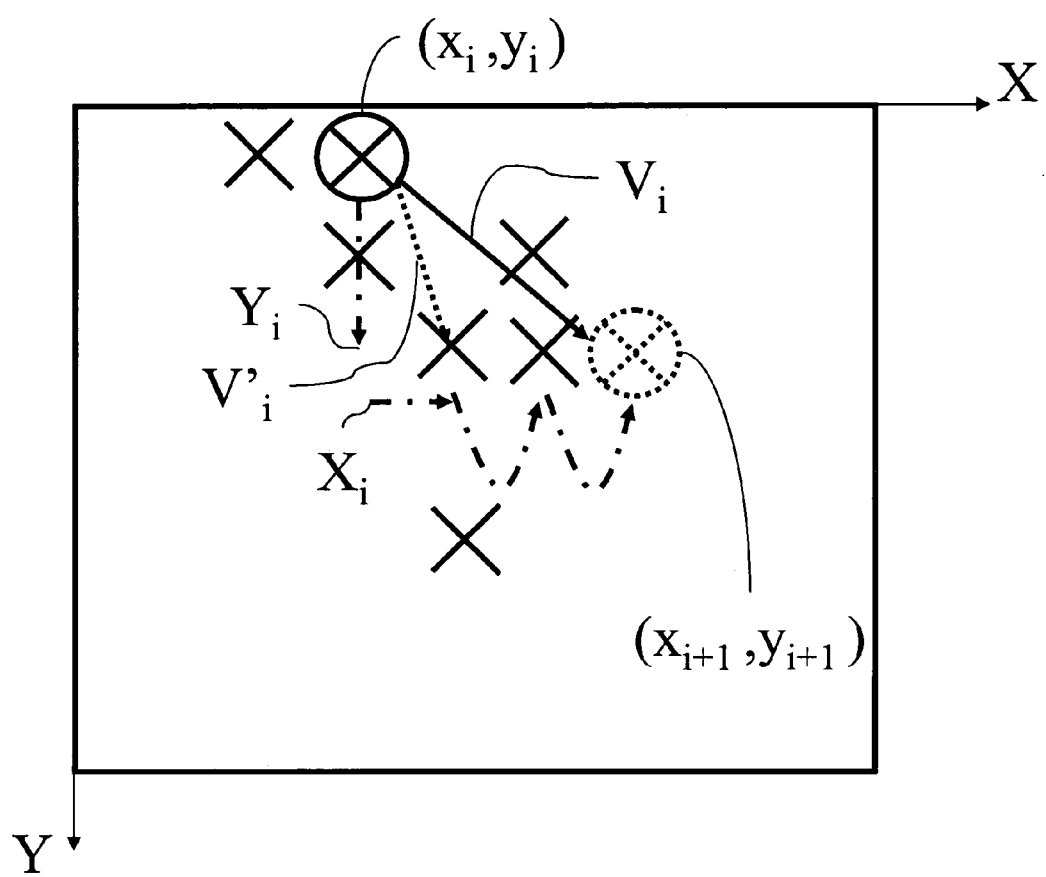
FIGS. 13 and 14 represent a vector reduction implemented according to the first embodiment of the invention.

FIG. 13 represents the application of the vector reduction according to the second variant of the first embodiment of the invention.

The vector $V_i$ determined at step S500 extends between the locations $(x_i, y_i)$ and $(x_{i+1}, y_{i+1})$. The locations already encoded are represented by crosses.

The vector $V_i$ is decomposed into two vectors $X_i$ and $Y_i$. In the case represented, it is the vector $X_i$ which is reduced (step S512).

The length of the resulting vector $V'_i$ is reduced with respect to the original vector $V_i$.

Figure 14:
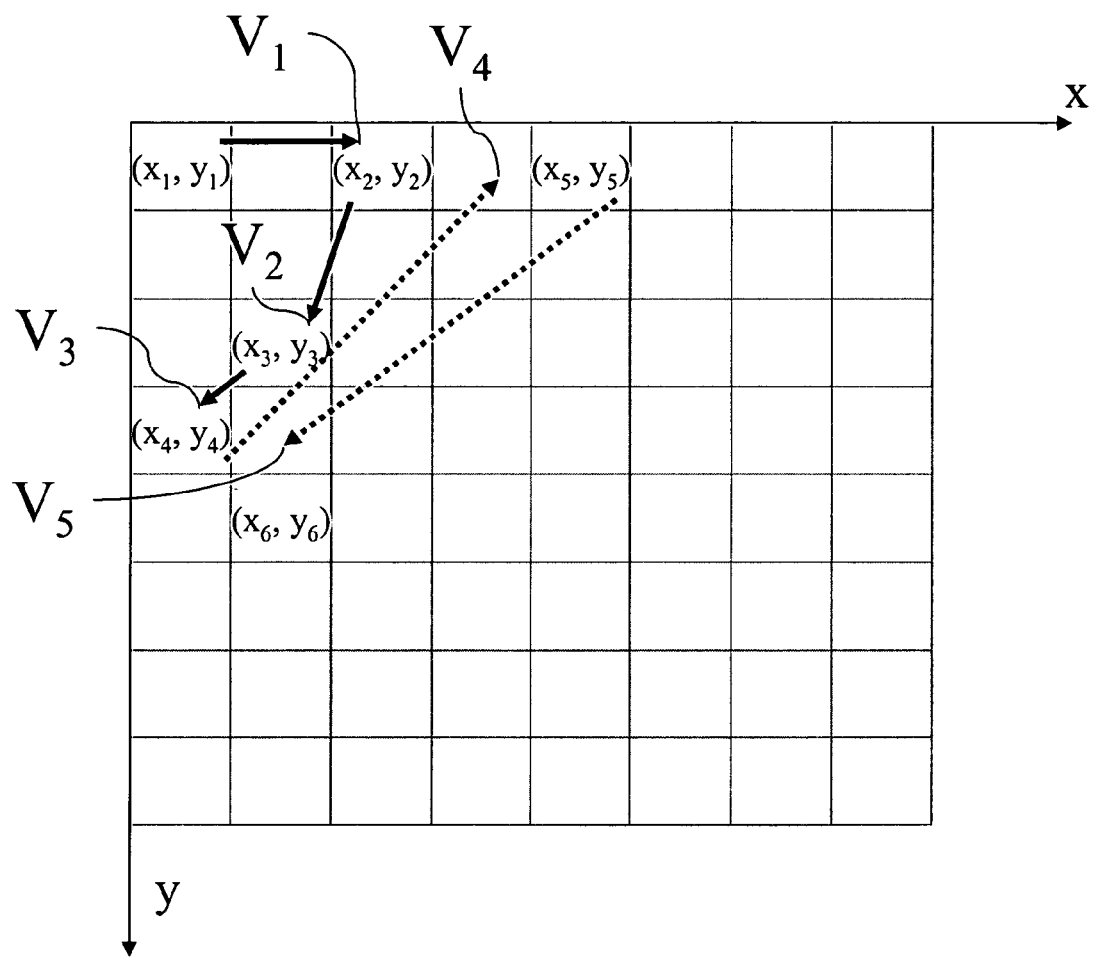

FIG. 14 represents the application of the vector reduction to the vectors of FIG. 12.

The total amplitude of the vectors is 15.65 before processing according to the invention and 14.13 after processing. The amplitudes have been measured in Euclidean distance.

The vectors are shorter, which reduces the information to be transmitted and which corresponds to an increase in compression.

Figure 15:
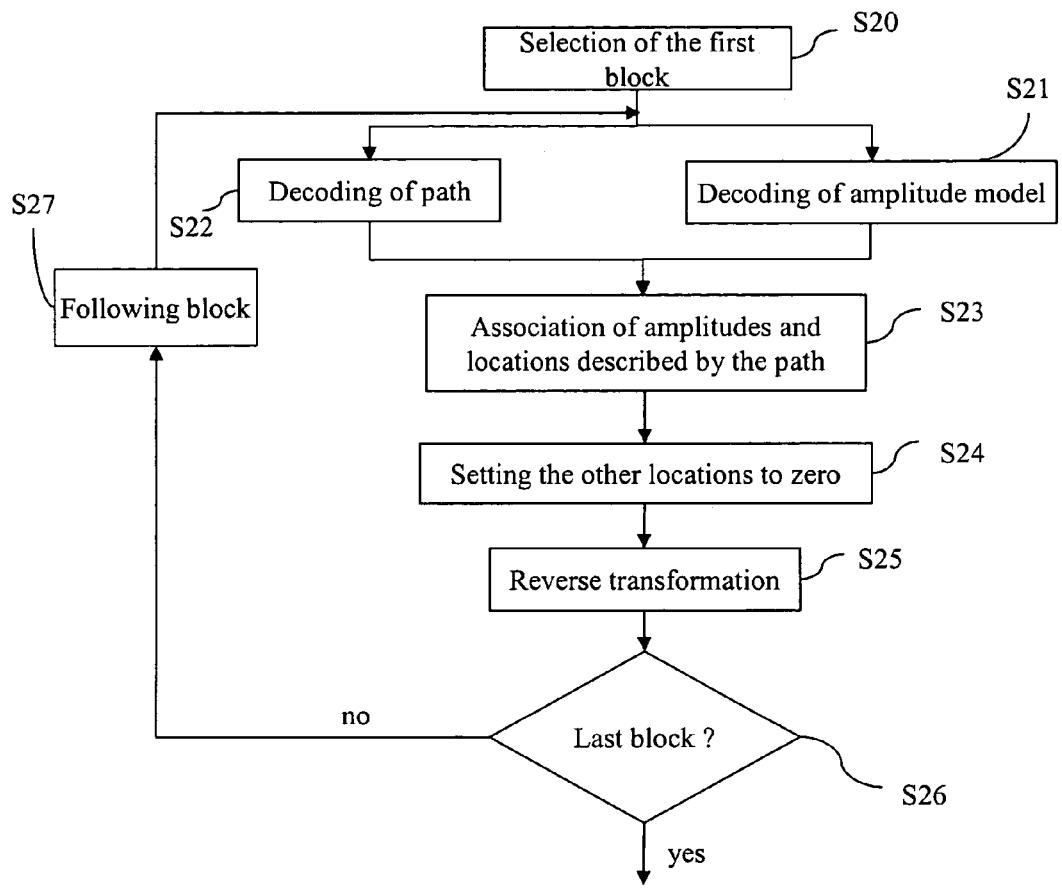
FIG. 15 represents an embodiment of a decoding method according to the first embodiment of the invention.

FIG. 15 represents a first embodiment of a method of decoding data previously encoded according to the method of FIG. 3.

This method is implemented in the decoding device and comprises the steps S20 to S27.

The method is carried out in the form of an algorithm which can be stored in whole or in part in any means of information storage capable of cooperating with the microprocessor. This storage means is readable by a computer or by a microprocessor. The storage means is integrated or not into the device, and may be removable. For example, it may comprise a magnetic tape, a diskette or a CD-ROM (fixed memory compact disk).

Step S20 is an initialization at which the encoding data of the first block are considered.

The following step S21 is the decoding of the amplitude model. The result is the amplitude model of the coefficients of the current block.

Step S20 is also followed by step S22 which is the decoding of the coordinates of the coefficients. This decoding will be detailed below. The path is decoded to provide the locations of the coefficients in the decoded block.

Steps S21 and S22 are followed by step S23 which is the association of an amplitude with each decoded location. For this, a value provided by the amplitude model is attributed to each coefficient location determined at step S22. The location of the $K^{th}$ coefficient decoded receives the $K^{th}$ component of the code vector constituting the amplitude model.

The following step S24 is the setting to zero of the locations of the block which were not in the path. The result of steps S23 and S24 is a block B'.

The following step S25 is an inverse DCT transformation of the block B' obtained at the preceding step.

The following step S26 is a test to determine whether the current block is the last block to decode.

If the response is negative, this step is followed by the step S27 at which a following block is considered. Step S27 is followed by the previously described steps S21 and S27.

If the response is positive at step S26, then the decoding of the image is terminated.

Figure 16:
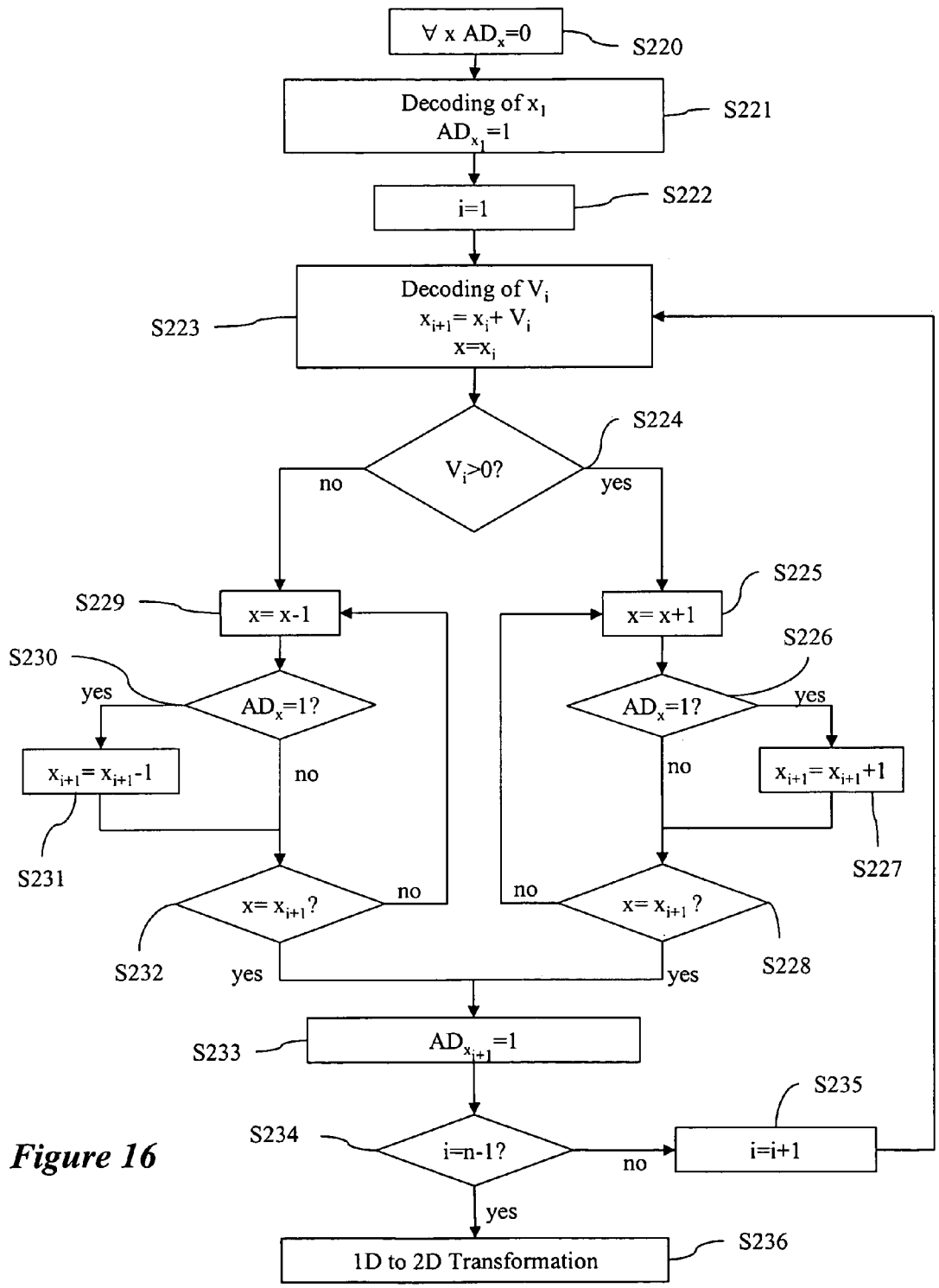
FIG. 16 represents a first variant of decoding locations of coefficients implemented according to the first embodiment of the invention.

A first variant of the step S22 of decoding the path is detailed with reference to FIG. 16 in the form of an algorithm comprising steps S220 to S236. This is the case in which the path is formed in a mono-dimensional vector.

Step S220 is an initialization at which a binary decoding parameter $AD_x$ is associated with each of the locations x of the current mono-dimensional vector. All the decoding parameters ADx are set to the value zero at step S220.

For the following processing, the decoding parameter ADx has the value zero if the location x has not yet been decoded, and has the value one once the location x has been decoded.

The following step S221 is a decoding of the first location $x_1$ of the path. The parameter $AD_{x1}$ which is associated with it is set to the value one.

The following step S222 is an initialization at which a parameter i is initialized to the value one.

At the following step S223, the vector $V_i$ is decoded. The location $x_{i+1} = V_1 + x_i$ is considered. A location parameter x is set to the value $x_i$.

The following step S224 is a test to determine if the current vector $V_1$ is oriented in one direction or the other. For example an axis of coordinates of which the origin is at $x_1$ is considered. Thus, as for the encoding, it is tested here whether the vector $V_i$ is positive or negative.

When the current vector $V_i$ is positive, step S224 is followed by step S225 at which the location parameter x is incremented by one unit, in order to consider the location immediately to the right of the current location.

The following step S226 is a test to determine whether the decoding parameter of location x has the value one, that is to say whether location x has already been decoded.

If the response is positive, step S226 is followed by step S227 at which the value of the location $x_{i+1}$ is incremented by one unit, so as to "skip" the location already decoded.

If the response is negative at step S226, this step is followed by the step S228. In the same way, step S227 is followed by the step S228.

Step S228 is a test to determine whether the current value of the location parameter x is equal to $x_{i+1}$.

If the response is negative, that means that all the locations between the positions $x_i$ and $x_{i+1}$ have not yet been considered. Step S228 is then followed by the step S225 already described.

If the response is positive at step S228, that means that all the locations between the positions $x_i$ and $x_{i+1}$ have been tested in order to know whether they have already been decoded or not. The location of the coefficient $x_{i+1}$ has been deduced from the location of $x_i$ and from the reduced vector $V_i$, taking into account the locations encountered that have already been decoded.

When the current vector $V_i$ is negative, step S224 is followed by step S229 at which the location parameter x is decremented by one unit, in order to consider the location immediately to the left of the current location.

The following step S230 is a test to determine whether the decoding parameter of location x has the value one, that is to say whether location x has already been decoded.

If the response is positive, step S230 is followed by step S231 at which the value of the location $x_{i+1}$, is decremented by one unit, so as to "skip" the location already decoded.

If the response is negative at step S230, this step is followed by the step S232. In the same way, step S231 is followed by the step S232.

Step S232 is a test to determine whether the current value of the location parameter x is equal to $x_{i+1}$.

If the response is negative, that means that all the locations between the positions $x_i$ and $x_{i+1}$ have not yet been considered. Step S232 is then followed by the step S229 already described.

If the response is positive at step S232, that means that all the locations between the positions $x_i$ and $x_{i+1}$ have been tested in order to know whether they have already been decoded or not. The location of the coefficient $x_{i+1}$ has been deduced from the location of $x_i$ and from the reduced vector $V_i$, taking into account the locations encountered that have already been decoded.

Steps S228 and S232 are followed by the step S233 at which the decoding parameter $AD_{xi+1}$ of the location $x_{i+1}$ is set to the value one.

The following step S234 is a test to determine whether the parameter i has the value n−1, i.e. whether all the vectors to be decoded have been processed.

If the response is negative, then step S234 is followed by the step E235 at which the parameter i is incremented by one unit in order to consider a following vector. Step S235 is followed by the step S223 already described.

When the response is positive at step S234, that step is followed by the step S236 which is the transformation of the mono-dimensional vector into a bidimensional block.

Figure 17:
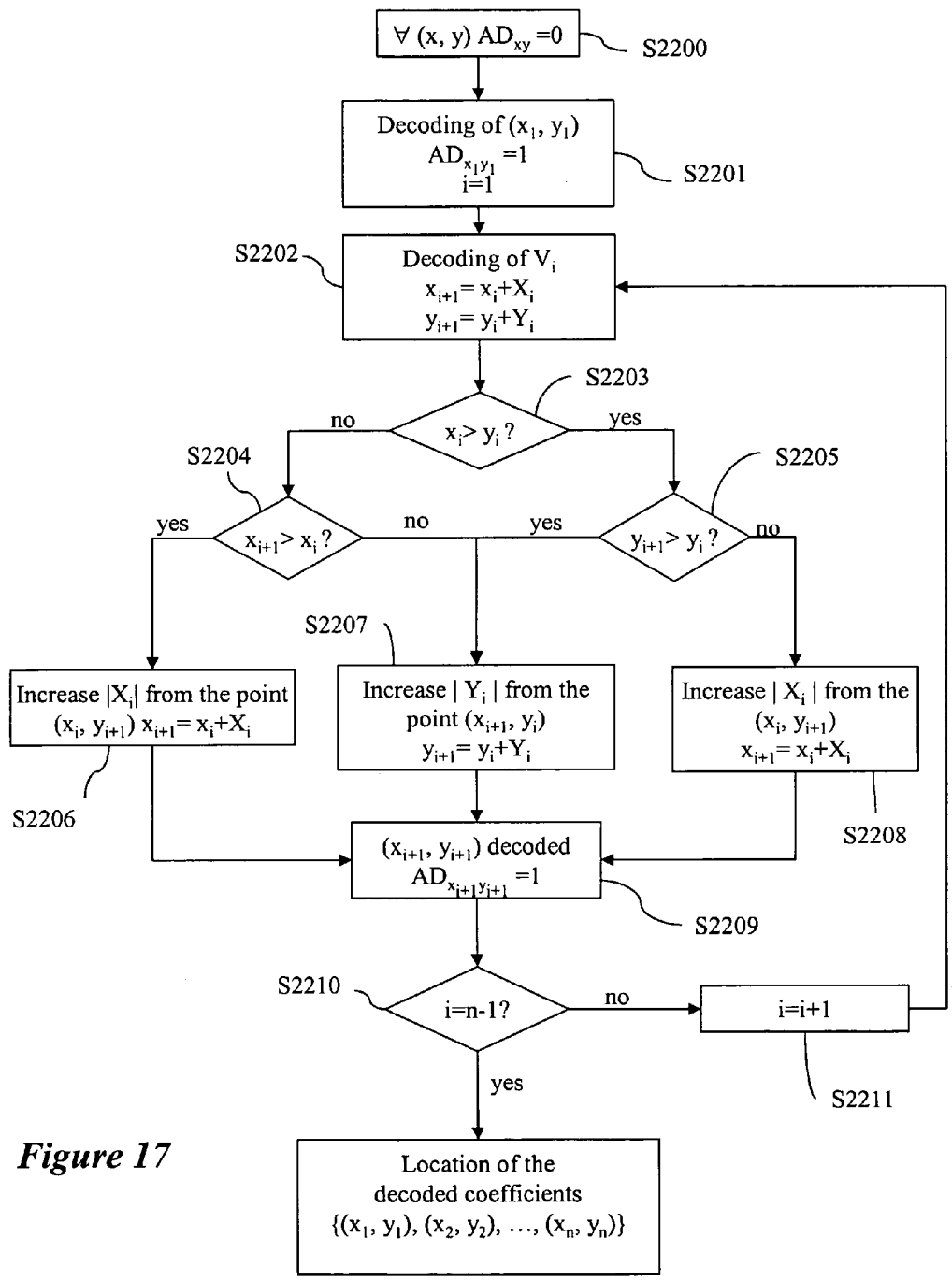
FIG. 17 represents a second variant of decoding locations of coefficients implemented according to the first embodiment of the invention.

The second variant of step S22 of decoding the locations of the coefficients of the current block is detailed in FIG. 17 in the form of an algorithm comprising steps S2200 to S2211. This embodiment corresponds to the case of the encoding of vectors formed directly in the bidimensional code-block.

Step S2200 is an initialization at which a binary decoding parameter $AD_{xy}$ is associated with each of the locations (x, y) of the current block. All the decoding parameters $AD_{xy}$ are set to the value zero at step S2200.

For the following processing, the decoding parameter $AD_{xy}$ has the value zero if the location (x, y) has not yet been decoded, and has the value one once the location (x, y) has been decoded.

The following step S2201 is a decoding of the first location $(x_i, y_i)$ of the path. The parameter $AD_{x1y1}$ which is associated with it is set to the value one.

Furthermore, a parameter i is initialized to the value one.

At the following step S2202, the vector $V_i$ is decoded. The vector $V_i$ is composed of a vector $X_i$ and a vector $Y_i$. The location $(x_{i+1}, y_{i+1})$ is considered such that:

$$x_{i+1} = X_i + x_i.$$

$$y_{i+1} = Y_i + y_i.$$

The following step S2203 is a test to determine whether the coordinate $x_i$ is greater than the coordinate $y_i$.

If the response is negative, step S2203 is then followed by the step S2204 which is a test to determine whether the coordinate $x_{i+1}$ is greater than the coordinate $x_i$.

If the response is positive at step S2203, then step S2203 is followed by the step S2205 which is a test to determine whether the coordinate $y_{i+1}$ is greater than the coordinate $y_i$.

When the response is positive at step S2204, that step is followed by the step S2206 at which the vector $X_i$ is processed as a mono-dimensional vector (first variant). The mono-dimensional vector which is considered here is formed between the points $(x_i, y_{i+1})$ and $(x_{i+1}, y_{i+1})$. After increasing the mono-dimensional vector, the coordinate $x_{i+1}$ is then equal to: $x_i + X_i$.

When the response is negative at step S2204, or when the response is positive at step S2205, that step is followed by the step S2207 at which the vector $Y_i$ is processed as a mono-dimensional vector (first variant) The mono-dimensional vector which is considered here is formed between the points $(x_{i+1}, y_i)$ and $(x_{i+1}, y_{i+1})$. After increasing the mono-dimensional vector, the coordinate $y_{i+1}$ is then equal to: $y_i + Y_i$.

When the response is negative at step S2205, that step is followed by the step S2208 at which the vector $X_i$ is processed as a mono-dimensional vector (first variant). The mono-dimensional vector which is considered here is formed between the points $(x_i, y_{i+1})$ and $(x_{i+1}, y_{i+1})$. After increasing the mono-dimensional vector, the coordinate $x_{i+1}$ is then equal to: $x_i + X_i$.

Steps S2206, S2207 and S2208 are followed by the step S2209 at which the decoding parameter $AD_{xi+1yi+1}$ of the location $(x_{i+1}, y_{i+1})$ is set to the value one.

The following step S2210 is a test to determine whether the parameter i has the value n−1, i.e. whether all the vectors to be decoded have been processed.

If the response is negative, then step S2210 is followed by the step S2211 at which the parameter i is incremented by one unit in order to consider a following vector. Step S2211 is followed by the previously described step S2202.

When the response is positive at step S2210, the decoding of the path according to the invention is terminated.

FIGS. 18 to 21 concern the second embodiment of the invention.

Figure 18:
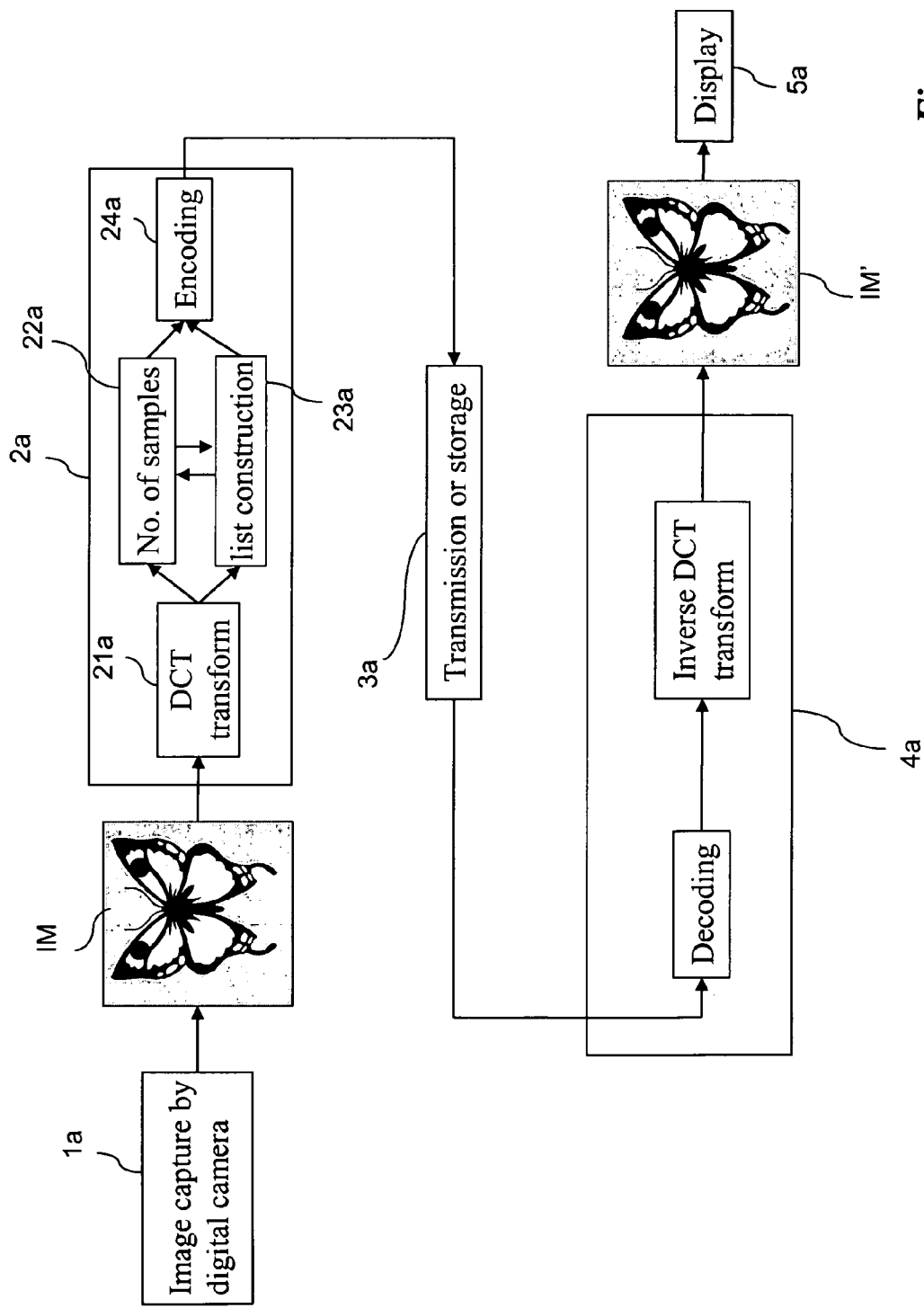
FIG. 18 represents an encoding device and a corresponding decoding device, according to a second embodiment of the invention.

With reference to FIG. 18, an embodiment of an encoding device 3a according to the second embodiment of the invention is adapted to encode a digital signal with the object of compressing it. The encoding device is integrated into an apparatus, which is for example a digital camera, a digital camcorder, a scanner, a printer, a photocopier, a fax machine, a database management system, or a computer.

A digital camera 1a acquires a digital image IM. The image is transmitted to an encoding device 2a of which the operation will be detailed in what follows with the help of algorithms.

The encoding device comprises a transformation module 21a. According to the invention, it comprises:

means 22a for determining a number of samples to encode, means 23a for constructing a list comprising the determined number of samples, classified by decreasing amplitude.

Finally, it comprises a module 24a for actual encoding.

The encoded image may be transmitted by a transmission module 3a operating conventionally, to a decoding device 4a. As a variant, the encoded image is simply stored in memory to be decoded later.

The decoded image IM' may for example be transmitted to a display device 5a.

Figure 19:
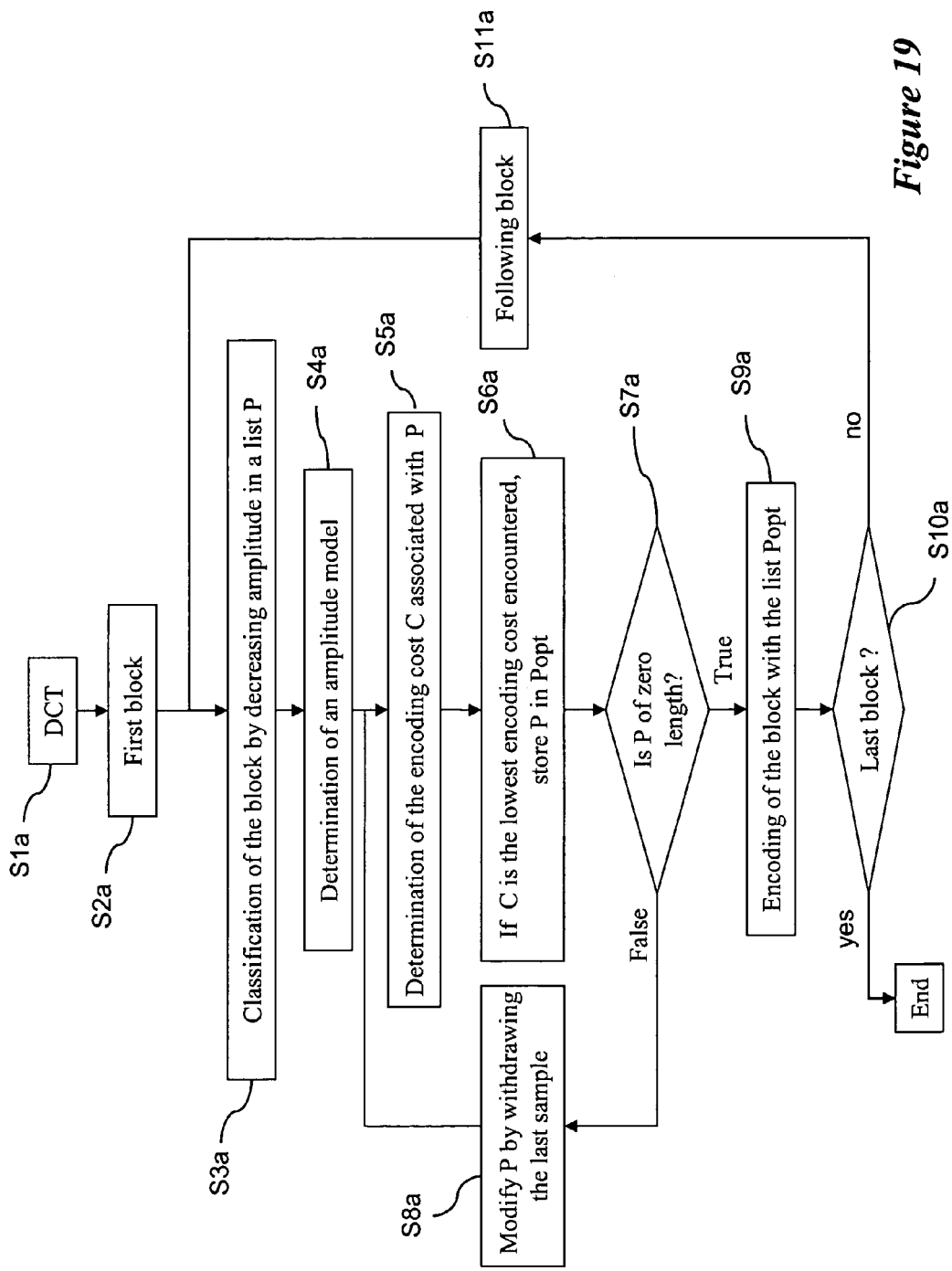
FIG. 19 represents a first variant of an encoding method according to the second embodiment of the invention.

FIG. 19 represents a first variant of a method of encoding an image, according to the second embodiment of the invention. This method is implemented in the encoding device and comprises steps S1a to S11a.

The method generally comprises a transformation of the signal to be encoded, then the determination of an amplitude model of the coefficients output from the transformation. The locations of these coefficients are next encoded according to a method using a path established between the coefficients.

Such an encoding method is described for example in French patent application No. 01 06933, as follows.

A first step will consist in an encoding of the sign of the coefficients. The coefficients being of real value, the sign information will first of all be encoded independently, by transmitting for example a binary value at 0 for a plus sign and at 1 for a minus sign.

The rate is simple to measure since we have an entropic code which is associated with each displacement vector. The number of bits necessary for the encoding of a vector can thus be obtained directly.

This type of problem is well known in combinatorics. It is known as the traveling salesman problem, in which a certain number of towns have to be gone through in an order which minimizes the total distance. In this case, our problem is a particular instance called the time-dependent traveling salesman problem.

Indeed, the cost associated with the passage from one sample to another depends on the path already followed, since the decoding distortion of a sample depends on the rank at which it will be decoded.

The solution of this type of problem is found by use of an evolutionary algorithm. Once the optimum path in terms of rate-distortion has been obtained, the first coefficient is encoded.

It should be noted that it is necessary to encode the first coefficient transmitted in a different manner to the others. In order to simplify the encoding of this coefficient, one could for example arbitrarily encode its location using a vector of displacement with respect to the point of coordinates (16, 16), that is to say the center of the block.

Next, for all the other coefficients except the last, the central processing unit will encode the displacement vector will be encoded. At this step, there are transmitted the coordinates of the vector of displacement from the coordinates of the previously encoded coefficient.

Displacement vector is understood to mean the vector of which the coordinates are the differences between the coordinates of the second point and of the first. It should be noted that in theory this solution may seem less beneficial than a conventional solution in which the position of the coefficients would be directly encoded since a difference over 32 coefficients is encoded over 6 bits instead of 5 (from −31 to +32). Nevertheless, the nature of the signal is such that in general, the coefficients of high amplitude are found to be accumulated in the same place in a sub-band. It is therefore worthwhile to encode the points with reference to each other, such that the displacement vectors remain very small on average.

Thus, by applying an entropic encoding to these vectors, it will be possible to obtain a code that is more compact.

For as long as all the vectors have not been encoded, the step of decoding the displacement vector for all the other coefficients except the last will be reiterated. Once all the coefficients have been encoded, the it is verified if all the blocks have been processed.

The method is carried out in the form of an algorithm which can be stored in whole or in part in any means of information storage capable of cooperating with the microprocessor. This storage means is readable by a computer or by a microprocessor. The storage means is integrated or not into the device, and may be removable. For example, it may comprise a magnetic tape, a diskette or a CD-ROM (fixed memory compact disk).

Step S1a is a linear or non-linear transformation of a digital image IM to be processed according to the invention.

In the preferred embodiment of the invention, the transformation is a discrete cosine transformation (DCT) by blocks, such as that applied under the JPEG standard.

In variant form, another transformation is used, for example a discrete wavelet transformation, as in the JPEG2000 standard.

The following processing is performed block by block, since the DCT transformation generates blocks. If the transformation does not generate blocks, the processing is applied globally to the entire image.

The following step S2a is an initialization at which a first block is considered.

The following step S3a consists of classifying the coefficients of the current block according to decreasing amplitude. This results in a list P of coefficients.

The following step S4a is the determination of an amplitude model. For this, a function for approximating the series of the classified coefficients is determined. This function is for example a decreasing exponential defined by a set of parameters which are determined by regression. French patent application No. 01 06933 describes this step in detail, as follows.

The method will choose, from the series of P coefficients arranged from the greatest to the least and named by the series $x_1, x_2, x_3, \ldots, x_p$, a set A comprising a finite number of R parameters $a_1, a_2, \ldots, B_R$. For example, a decreasing exponential family could be chosen, written $f_A(x)=a_1 \cdot \exp(a_3 \cdot x+a_4) \cdot a_2$.

The method will then determine among a family of real functions that which reproduces as accurately as possible the evolution of the values of the $x_i$ as a function of their rank i.

At these steps, the parameters $a_1$, $a_2$, $a_3$, and $a_4$ will be determined such that the function $f_A$ is the closest possible to the points $(1, x_1), (2, x_2), \ldots, (P, x_p)$. This typical problem is called function regression. Numerous techniques exist for finding the best set of parameters. For example minimization of the root mean square error RMSE could be sought, equal to $$RMSE = \frac{1}{p}\sqrt{\sum_{i=1}^{p}(x_i - f_A(i))^2}.$$

To achieve this, it could be chosen to quantize each parameter $a_t$ into a finite number of possible values. There are then a finite number of different values of parameters of A. The RMSE value is then calculated for each set of parameters and is then stored with the value of the parameters associated. When all the parameters have been incremented, the set which minimizes RMSE from among the stored parameters will be chosen.

FIG. 4 shows an example of an amplitude model A. A value A(k) supplied by the amplitude model corresponds to each integer value k along the x-axis. The value A(k) is an approximation of the amplitude of the $k^{th}$ coefficient classified in decreasing order.

The following step S5a is the determining of an encoding cost associated with the list P. The cost of encoding a block is the function $C=R+\lambda\cdot$, in which R represents the rate of transmission of the encoded form of the block, D represents the distortion generated in the block reconstructed after encoding and decoding, with respect to the original image, and $\lambda$ is a parameter of adjustment between compression of the image and distortion generated by the encoding.

It should be noted that the distortion is calculated by performing the sum of the squared errors between the amplitude of each coefficient of the block and the amplitude which it will have after decoding.

The following step S6a is the storage in memory of the list P as the optimum list $P_{opt}$, if the encoding cost C calculated at the previous step is less than the encoding cost of the optimum list $P_{opt}$ previously stored in memory. When this step is gone through the first time, the current list is stored as the optimum list.

The following step S7a is a test to determine whether the current list P has zero length.

If the response is negative, this step is followed by the step S8a at which the current list P is modified. The last sample is withdrawn from the list, which results in a new list. Step S8a is followed by the previously described step S5a.

If the response is positive at step S7a, that step is followed by the step S9a which is the encoding of the current block with the list $P_{opt}$ i.e. with the list which provides the lowest encoding cost. That step is also detailed in French patent application No. 01 06933, as follows.

A first step will consist of an encoding of the sign of the coefficients. The coefficients being of real value, the sign information will first of all be encoded independently, by transmitting for example a binary value at 0 for a plus sign and at 1 for a minus sign.

Once the optimum path in terms of rate-distortion has been obtained, the first coefficient is encoded.

It should be noted that it is necessary to encode the first coefficient transmitted in a different manner to the others. In order to simplify the encoding of this coefficient, one could for example arbitrarily encode its location using a vector of displacement with respect to the point of coordinates (16, 16), that is to say the center of the block.

Next, for all the other coefficients except the last, the central processing unit will encode the displacement vector will be encoded. At this step, there are transmitted the coordinates of the vector of displacement from the coordinates of the previously encoded coefficient.

Displacement vector is understood to mean the vector of which the coordinates are the differences between the coordinates of the second point and of the first. It should be noted that in theory this solution may seem less beneficial than a conventional solution in which the position of the coefficients would be directly encoded since a difference over 32 coefficients is encoded over 6 bits instead of 5 (from −31 to +32). Nevertheless, the nature of the signal is such that in general, the coefficients of high amplitude are found to be accumulated in the same place in a sub-band. It is therefore worthwhile to encode the points with reference to each other, such that the displacement vectors remain very small on average.

Thus, by applying an entropic encoding to these vectors, it will be possible to obtain a code that is more compact.

For as long as all the vectors have not been encoded, the steps of decoding the displacement vector for all the other coefficients except the last will be reiterated. Once all the coefficients have been encoded, it is verified if all the blocks have been processed.

Step S9a comprises the encoding of the locations of the coefficients based on the list $P_{opt}$. To do this, a path is determined by an initial coefficient and the list of vectors joining the other coefficients. Each coefficient of the path different from the initial coefficient is represented by a vector describing its location with respect to the preceding coefficient in the path. It should be noted that the path does not necessarily include all the coefficients of the current block. This is because it is possible to encode only part of the coefficients and to set the other coefficients to the value zero at the time of later encoding.

Once the path has been determined, the coordinates of the initial coefficient are encoded by binary encoding and the vectors are encoded by entropic encoding.

The encoded form of a block of the image comprises an amplitude model which supplies an approximation of the amplitude of the coefficients and a path which supplies an ordered series of the locations of the coefficients. The location of the $k^{th}$ coefficient of this series is determined by the path and its amplitude is determined by the y-coordinate corresponding to the x-coordinate k according to the amplitude model.

The following step S10a is a test to determine whether the current block is the last block of the image to encode.

If the response is negative, this step is followed by the step S11a at which a following block is considered. Step S11a is followed by the previously described step S3a.

If the response is positive at step S10a, then the encoding of the image is terminated.

Figure 20:
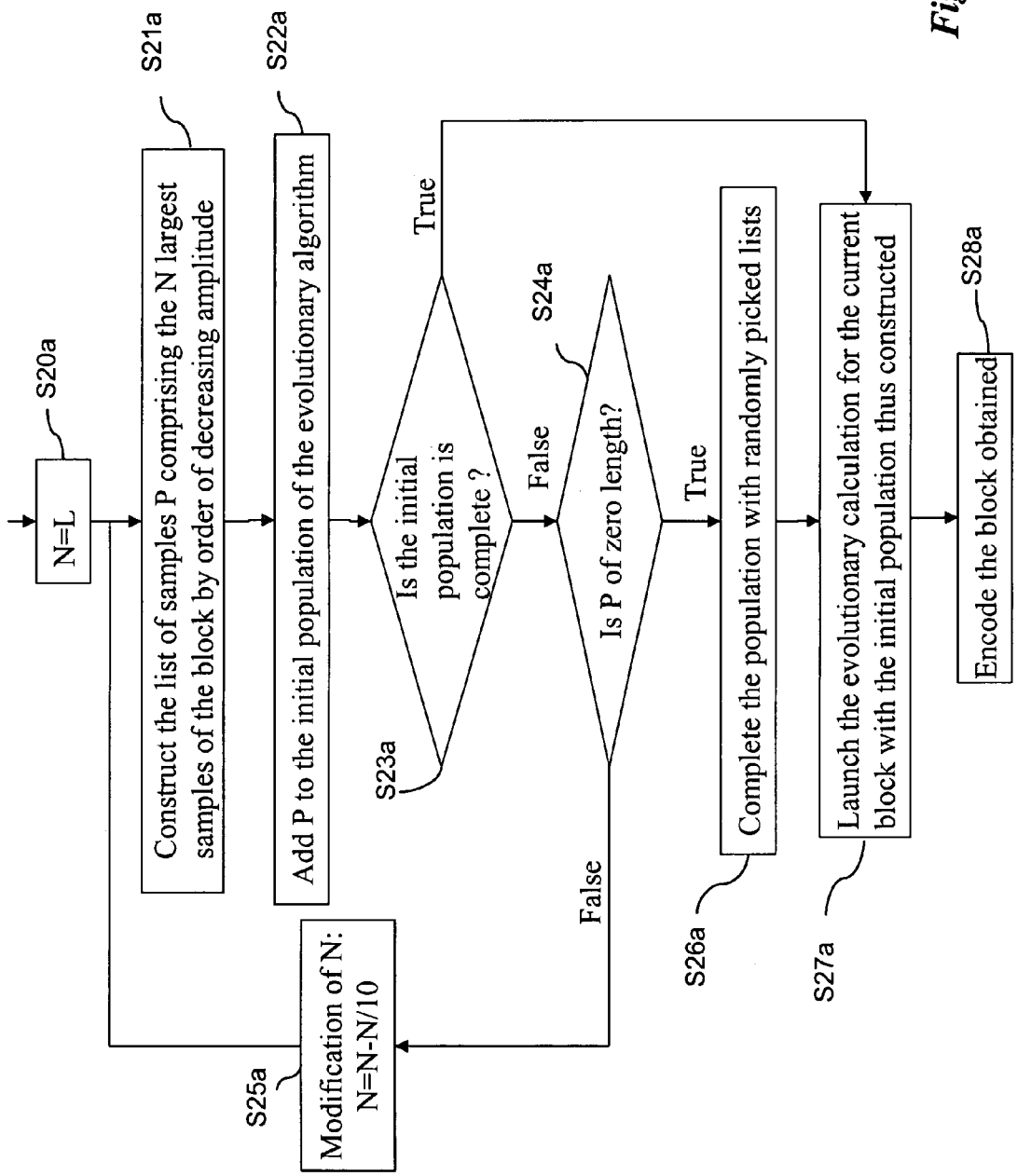
FIG. 20 represents a second variant of an encoding method according to the second embodiment of the invention.

FIG. 20 shows a second variant of a method of encoding an image, according to the second embodiment of the invention. This method is implemented in the encoding device and comprises the steps S20a to S28a.

Here too, the method generally comprises a transformation of the signal to be encoded, then the determination of an amplitude model of the coefficients output from the transformation. The locations of these coefficients are next encoded according to a method using a path established between the coefficients.

Such an encoding method is described for example in French patent application No. 01 06933, as follows.

A first step will consist in an encoding of the sign of the coefficients. The coefficients being of real value, the sign information will first of all be encoded independently, by transmitting for example a binary value at 0 for a plus sign and at 1 for a minus sign.

The rate is simple to measure since we have an entropic code which is associated with each displacement vector. The number of bits necessary for the encoding of a vector can thus be obtained directly.

This type of problem is well known in combinatorics. It is known as the traveling salesman problem, in which a certain number of towns have to be gone through in an order which minimizes the total distance. In this case, our problem is a particular instance called the time-dependent traveling salesman problem.

Indeed, the cost associated with the passage from one sample to another depends on the path already followed, since the decoding distortion of a sample depends on the rank at which it will be decoded.

The solution of this type of problem is found by use of an evolutionary algorithm. Once the optimum path in terms of rate-distortion has been obtained, the first coefficient is encoded.

It should be noted that it is necessary to encode the first coefficient transmitted in a different manner to the others. In order to simplify the encoding of this coefficient, one could for example arbitrarily encode its location using a vector of displacement with respect to the point of coordinates (16, 16), that is to say the center of the block.

Next, for all the other coefficients except the last, the central processing unit will encode the displacement vector will be encoded. At this step, there are transmitted the coordinates of the vector of displacement from the coordinates of the previously encoded coefficient.

Displacement vector is understood to mean the vector of which the coordinates are the differences between the coordinates of the second point and of the first. It should be noted that in theory this solution may seem less beneficial than a conventional solution in which the position of the coefficients would be directly encoded since a difference over 32 coefficients is encoded over 6 bits instead of 5 (from −31 to +32). Nevertheless, the nature of the signal is such that in general, the coefficients of high amplitude are found to be accumulated in the same place in a sub-band. It is therefore worthwhile to encode the points with reference to each other, such that the displacement vectors remain very small on average.

Thus, by applying an entropic encoding to these vectors, it will be possible to obtain a code that is more compact.

For as long as all the vectors have not been encoded, the step of decoding the displacement vector for all the other coefficients except the last will be reiterated. Once all the coefficients have been encoded, the it is verified if all the blocks have been processed.

Here the invention concerns the initialization of the evolutionary calculation, and more particularly the determination of an initial population of lists of coefficients. This population comprises a predetermined number of individuals.

The method is carried out in the form of an algorithm which can be stored in whole or in part in any means of information storage capable of cooperating with the microprocessor. This storage means is readable by a computer or by a microprocessor. The storage means is integrated or not into the device, and may be removable. For example, it may comprise a magnetic tape, a diskette or a CD-ROM (fixed memory compact disk).

The encoding of a block of the image is considered here. The block considered comprises L coefficients.

Step S20 is an initialization at which the number N of coefficients of the list to construct is initialized to the value L.

The following step S21a is the construction of a list of coefficients which comprises the N largest coefficients of the block, classified in order of decreasing amplitude.

The following step S22a is the addition of the current list P to the initial population of the evolutionary algorithm.

The following step S23a is a test to determine whether the initial population comprises the desired number of individuals, which here are lists.

If the response is negative, that step is followed by the step S24a which is a test to determine if the current list P is of zero length.

If the response is negative at step S24a, that step is followed by step S25a which is a modification of the number N of coefficients of the list. For example, the number N is reduced by 10% and rounded to the nearest whole integer. Step S25a is followed by the previously described step S21a.

If the response is positive at step S24a, it is no longer possible to construct lists with coefficients of the block in the manner set out above and that step is followed by the step S26a at which the population is completed with lists picked randomly.

The following step S27a is the calculation of a list of coefficients by evolutionary calculation, based on lists constructed by the preceding steps as initial lists population. This calculation is performed as in French patent application No. 0106933, as follows.

The method will calculate the path which minimizes the cost of encoding, that is to say find the path linking Q elements of the set $\{x_1, \ldots, x_p\}$ such that the cost of encoding of this path is minimum. A measurement of encoding cost is thus made available.

In typical manner, this measurement is expressed, for a given signal, in the form B+λD, where B is the rate associated with the signal, D is the distortion with respect to the original after decoding of the signal, and A is a parameter fixed by the encoder or the user of the encoder.

The parameter λ determines the balance between compression and quality. The distortion is a simple measurement to calculate. This is because, when the decoder receives the information about the localization of the $k^{th}$ coefficient, the decoding value will be $f_A(k)$.

Thus, at the encoder, when the $k^{th}$ sample is in course of being encoded, the distortion is measured between the value of this sample and $f_A(k)$.

The rate is also simple to measure since we have an entropic code which is associated with each displacement vector. The number of bits necessary for the encoding of a vector can thus be obtained directly.

This type of problem is well known in combinatorics. It is known as the traveling salesman problem, in which a certain number of towns have to be gone through in an order which minimizes the total distance. In this case, our problem is a particular instance called the time-dependent traveling salesman problem.

Indeed, the cost associated with the passage from one sample to another depends on the path already followed, since the decoding distortion of a sample depends on the rank at which it will be decoded. The solution of this type of problem is found by use of an evolutionary algorithm.

If the response is positive at step S23a, this means that the number of lists of the initial population has been reached. That step is then followed by step S27a already described.

Step S27a is followed by step S28a which is the encoding of the current block on the basis of the list obtained at step S27a. Here too, the encoding is performed as in French patent application No. 0106933, as follows.

A first step will consist of an encoding of the sign of the coefficients. The coefficients being of real value, the sign information will first of all be encoded independently, by transmitting for example a binary value at 0 for a plus sign and at 1 for a minus sign.

Once the optimum path in terms of rate-distortion has been obtained, the first coefficient is encoded.

It should be noted that it is necessary to encode the first coefficient transmitted in a different manner to the others. In order to simplify the encoding of this coefficient, one could for example arbitrarily encode its location using a vector of displacement with respect to the point of coordinates (16, 16), that is to say the center of the block.

Next, for all the other coefficients except the last, the central processing unit will encode the displacement vector will be encoded. At this step, there are transmitted the coordinates of the vector of displacement from the coordinates of the previously encoded coefficient.

Displacement vector is understood to mean the vector of which the coordinates are the differences between the coordinates of the second point and of the first. It should be noted that in theory this solution may seem less beneficial than a conventional solution in which the position of the coefficients would be directly encoded since a difference over 32 coefficients is encoded over 6 bits instead of 5 (from −31 to +32). Nevertheless, the nature of the signal is such that in general, the coefficients of high amplitude are found to be accumulated in the same place in a sub-band. It is therefore worthwhile to encode the points with reference to each other, such that the displacement vectors remain very small on average.

Thus, by applying an entropic encoding to these vectors, it will be possible to obtain a code that is more compact.

For as long as all the vectors have not been encoded, the steps of decoding the displacement vector for all the other coefficients except the last will be reiterated. Once all the coefficients have been encoded, it is verified if all the blocks have been processed.

FIGS. 21 to 27 concern the third embodiment of the invention.

Figure 21:
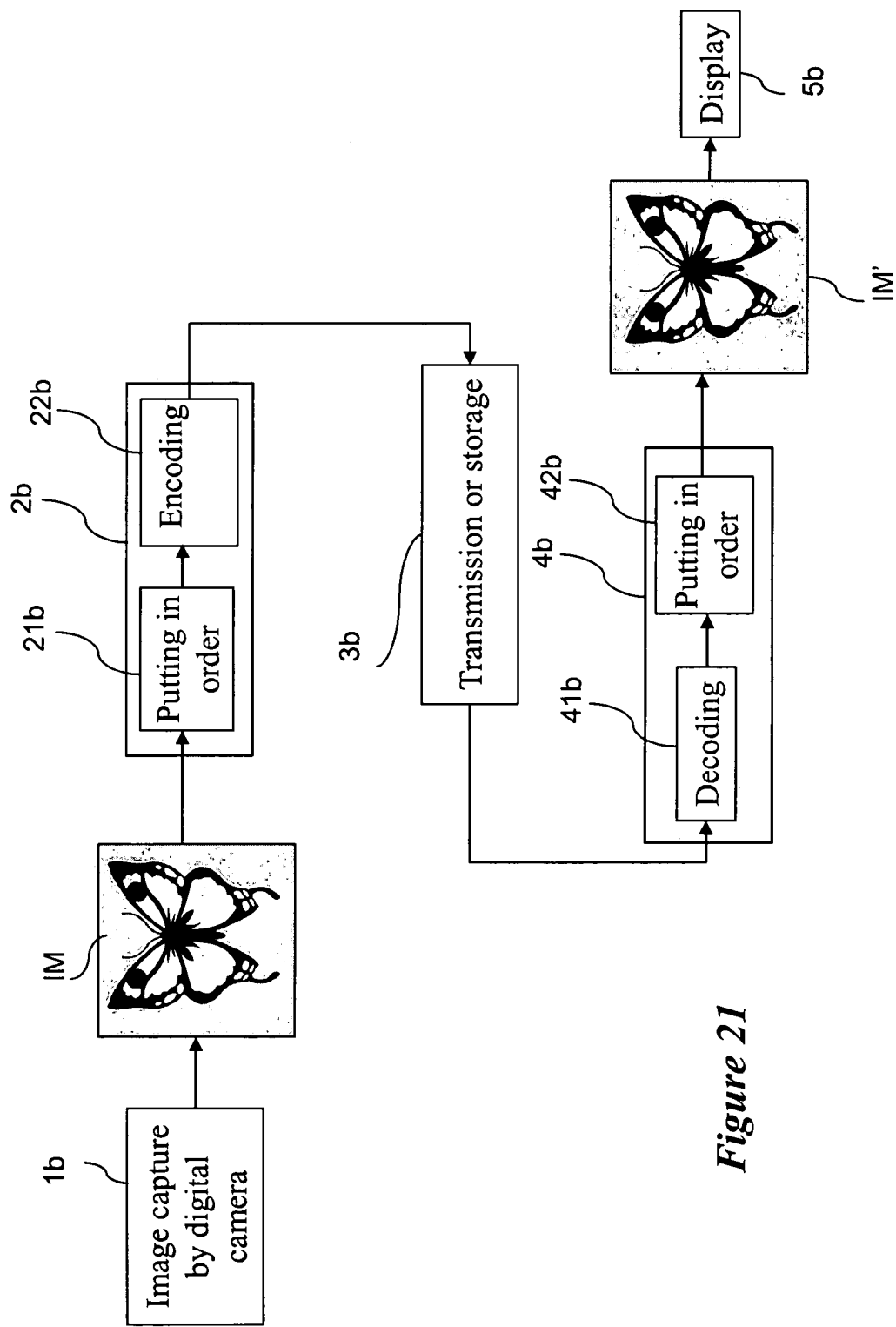
FIG. 21 shows an encoding device and a corresponding decoding device, according to the third embodiment of the invention.

With reference to FIG. 21, an embodiment of an encoding device 3b according to the third embodiment of the invention is adapted to encode a digital signal with the object of compressing it. The encoding device is integrated into an apparatus, which is for example a digital camera, a digital camcorder, a scanner, a printer, a photocopier, a fax machine, a database management system, or a computer.

A digital camera 1b acquires a digital image IM. The image is transmitted to an encoding device 2b of which the operation will be detailed in what follows with the help of algorithms.

The encoding device comprises means 22b for determining an amplitude model of the coefficients and a path between the coefficients.

According to the invention, it further comprises prior means 21b for putting the coefficients in order as a function of their respective locations in the set of data.

The encoded image may be transmitted by a transmission module 3b operating conventionally, to a decoding device 4b. As a variant, the encoded image is simply stored in memory to be decoded later.

The decoding device comprises means 41b for decoding an amplitude model of the coefficients and a path between the coefficients, so as to form a first set of decoded coefficients.

According to the invention, it comprises means 42b for putting the decoded coefficients in order as a function of their respective locations in the first set of decoded coefficients so as to form a second decoded set.

The decoded image IM' may for example be transmitted to a display device 5b.

The operation of the decoding device will be detailed below using algorithms.

Figure 22:
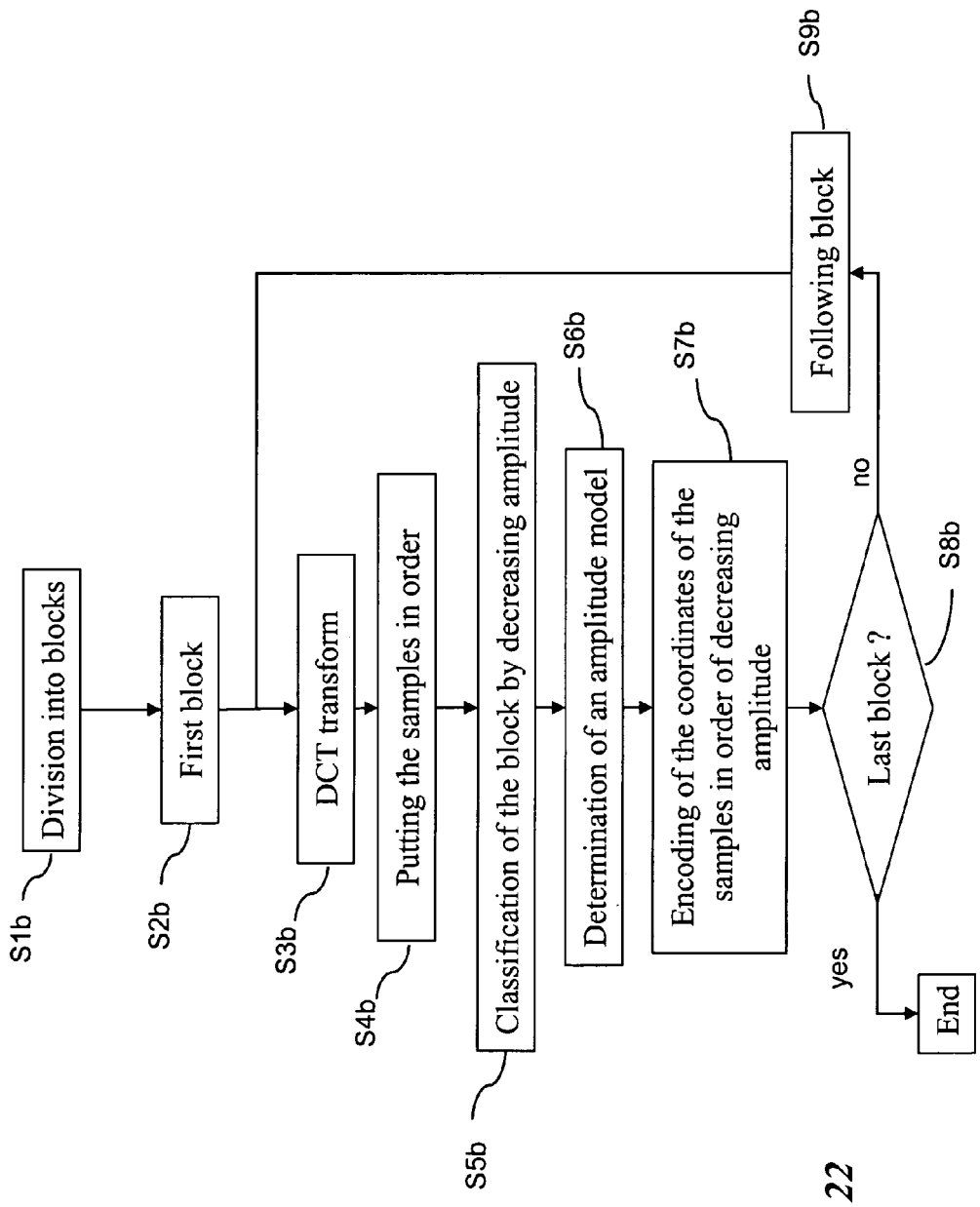
FIG. 22 shows an embodiment of an encoding method according to the third embodiment of the invention.

FIG. 22 shows an embodiment of a method of encoding an image, according to the third embodiment of the invention. This method is implemented in the encoding device and comprises the steps S1b to S9b.

The method generally comprises a transformation of the signal to be encoded, then the determination of an amplitude model of the coefficients output from the transformation. The locations of these coefficients are next encoded according to a method using a path established between the coefficients.

Such an encoding method is described for example in French patent application No. 01 06933.

The method is carried out in the form of an algorithm which can be stored in whole or in part in any means of information storage capable of cooperating with the microprocessor. This storage means is readable by a computer or by a microprocessor. The storage means is integrated or not into the device, and may be removable. For example, it may comprise a magnetic tape, a diskette or a CD-ROM (fixed memory compact disk).

Step S1b is the division of the image to be processed into blocks. The blocks are adjacent and are for example of square form comprising 8×8 samples.

The following step S2b is an initialization at which a first block is considered.

The following step S3b is a linear or non-linear transformation of the current block.

In the preferred embodiment of the invention, the transformation is a discrete cosine transformation (DCT) as for the JPEG standard.

In variant form, another transformation is used, for example a discrete wavelet transformation, as in the JPEG2000 standard.

In the following step S4b, the coefficients of the current block $B_i$ are put in order as a function of their respective locations in the block.

Figure 23:
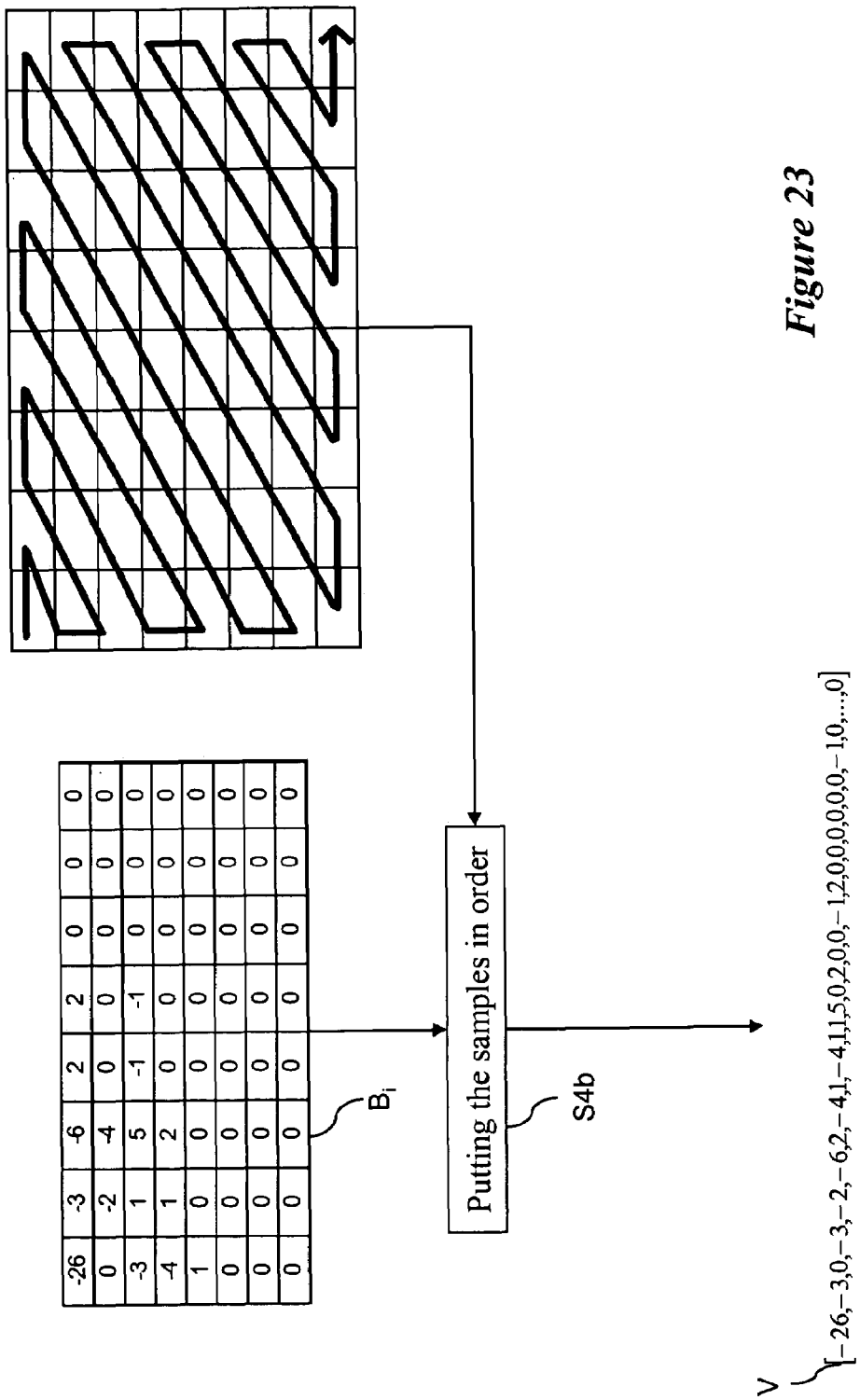
FIG. 23 represents a first variant for putting the coefficients in order as a function of their locations.

According to a first variant represented in FIG. 23, a zig-zag path is followed through block $B_i$.

In block $B_i$ the diagonals of coefficients oriented from bottom left to top right are considered. The path begins at the top left. The path passes through the diagonals either from bottom left to top right, or in the opposite sense. For a given diagonal, the direction of the path is the direction opposite to that of the preceding diagonal.

Following this path direction causes the coefficients to be arranged in a one-dimensional vector V containing 64 coefficients.

Figure 24:
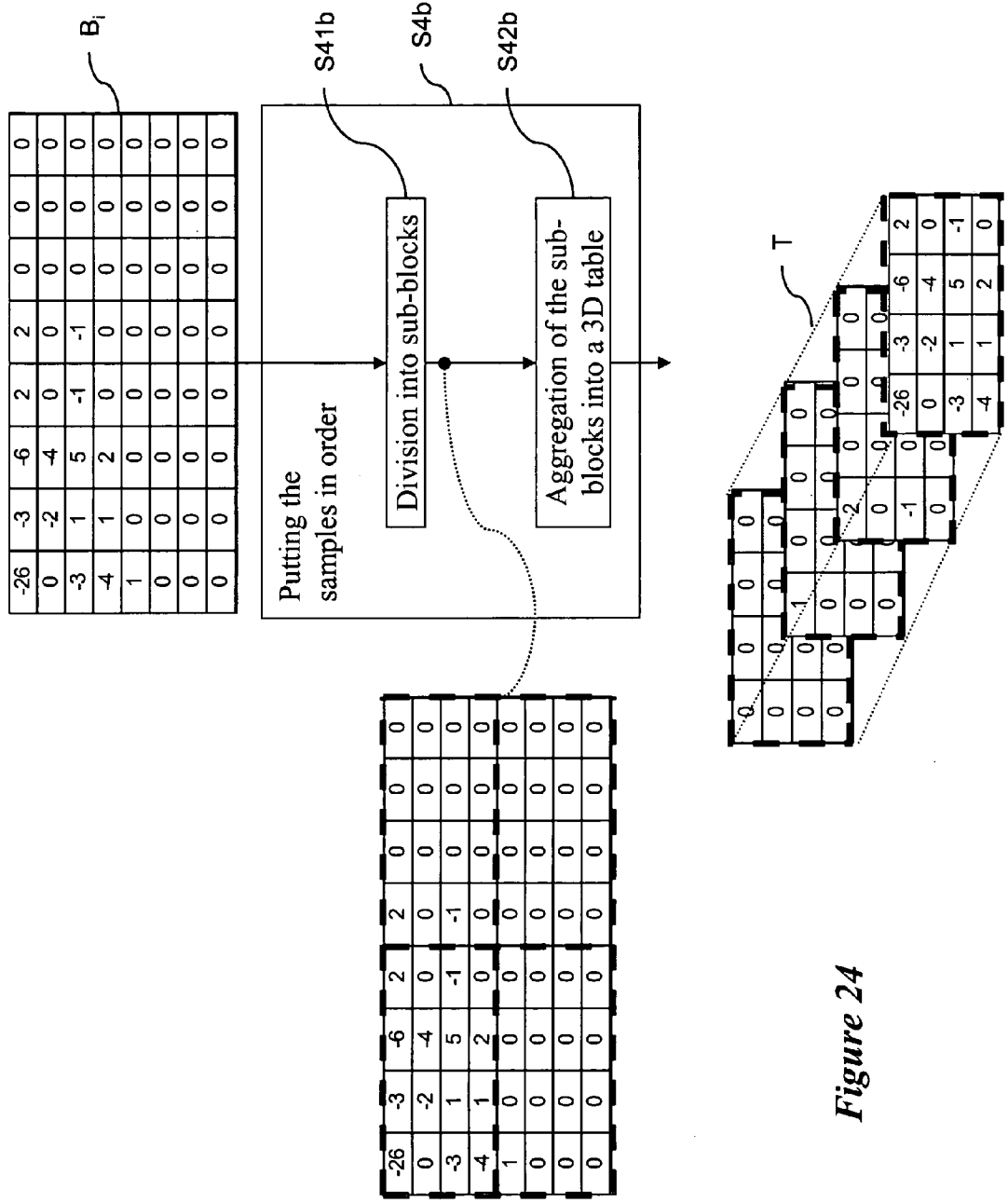
FIG. 24 represents a second variant for putting the coefficients in order as a function of their locations.

According to a second variant represented in FIG. 24, step S4b comprises two sub-steps S41b and S42b. During sub-step S41b, block B; is divided into four blocks, termed sub-blocks, each being of 4×4 coefficients.

The following sub-step S42b is the aggregation of the sub-blocks previously formed in a three-dimensional table. For this, the sub-blocks are considered in lexicographical order (from top left to bottom right). In this order, they are stacked up beginning at the highest level. The result is a three-dimensional table T with 4×4×4 coefficients.

With reference again to FIG. 22, step S4b is followed by step S5b which is a classification of the coefficients by decreasing amplitude.

It should be noted that due to the DCT transformation, the coefficients of highest amplitude have more chance of being at the top left of the 8×8 block resulting from the transformation.

Thus, in the first variant, the coefficients of greatest amplitude have more chance of being at the start of the vector V. The work of classification is thus partially made during the previous step, or at least is facilitated by that step.

In the second variant, the coefficients of greatest amplitude have more chance of being at the highest level of table T.

The classification is performed in conventional manner, for example by bubble sorting. This results in a list P of coefficients classified by decreasing amplitude.

The following step S6b is the determination of an amplitude model. For this, a function for approximating the list P of the classified coefficients is determined. This function is for example a decreasing exponential defined by a set of parameters which are determined by regression. French patent application No. 01 06933 describes this step in detail, as follows.

The method will choose, from the series of P coefficients arranged from the greatest to the least and named by the series $x_1, x_2, x_3, \ldots, x_p$, a set A comprising a finite number of R parameters $a_1, a_2, \ldots, B_R$. For example, a decreasing exponential family could be chosen, written $f_A(x) = a_1 \cdot \exp(a_3 \cdot x + a_4) a_2$.

The method will then determine among a family of real functions that which reproduces as accurately as possible the evolution of the values of the $x_i$ as a function of their rank i.

At these steps, the parameters $a_1$, $a_2$, $a_3$, and $a_4$ will be determined such that the function $f_A$ is the closest possible to the points $(1, x_1), (2, x_2), \ldots, (P, x_p)$. This typical problem is called function regression. Numerous techniques exist for finding the best set of parameters. For example minimization of the root mean square error RMSE could be sought, equal to $$RMSE = \frac{1}{p}\sqrt{\sum_{i=1}^{P}(x_i - f_A(i))^2}.$$

To achieve this, it could be chosen to quantize each parameter $a_i$ into a finite number of possible values. There are then a finite number of different values of parameters of A. The RMSE value is then calculated for each set of parameters and is then stored with the value of the parameters associated. When all the parameters have been incremented, the set which minimizes RMSE from among the stored parameters will be chosen.

FIG. 4 shows an example of an amplitude model A. A value A(k) supplied by the amplitude model corresponds to each integer value k along the x-axis. The value A(k) is an approximation of the amplitude of the $k^{th}$ coefficient classified in decreasing order.

The following step S7b is the encoding of the locations of the coefficients in the vector V or in the table T. To do this, a path is determined by an initial coefficient and the list of vectors joining the other coefficients. Each coefficient of the path different from the initial coefficient is represented by a vector describing its location with respect to the preceding coefficient in the path. It should be noted that the path does not necessarily include all the coefficients of the current block. This is because it is possible to encode only part of the coefficients and to set the other coefficients to the value zero at the time of later encoding.

It should be noted that in the first variant, the coordinates of the initial coefficient and vectors are one-dimensional, whereas in the second variant the coordinates are three-dimensional.

Once the path has been determined, the coordinates of the initial coefficient are encoded by binary encoding and the vectors are encoded by entropy encoding.

The encoded form of a block of the image comprises an amplitude model which supplies an approximation of the amplitude of the coefficients and a path which supplies an ordered series of the locations of the coefficients. The location of the $k^{th}$ coefficient of this series is determined by the path and its amplitude is determined by the y-coordinate corresponding to the x-coordinate k according to the amplitude model.

The following step S8b is a test to determine whether the current block is the last block of the image to encode.

If the response is negative, this step is followed by the step S9b at which a following block is considered. Step S9b is followed by the previously described step S3b.

If the response is positive at step S8b, then the encoding of the image is terminated.

Figure 25:
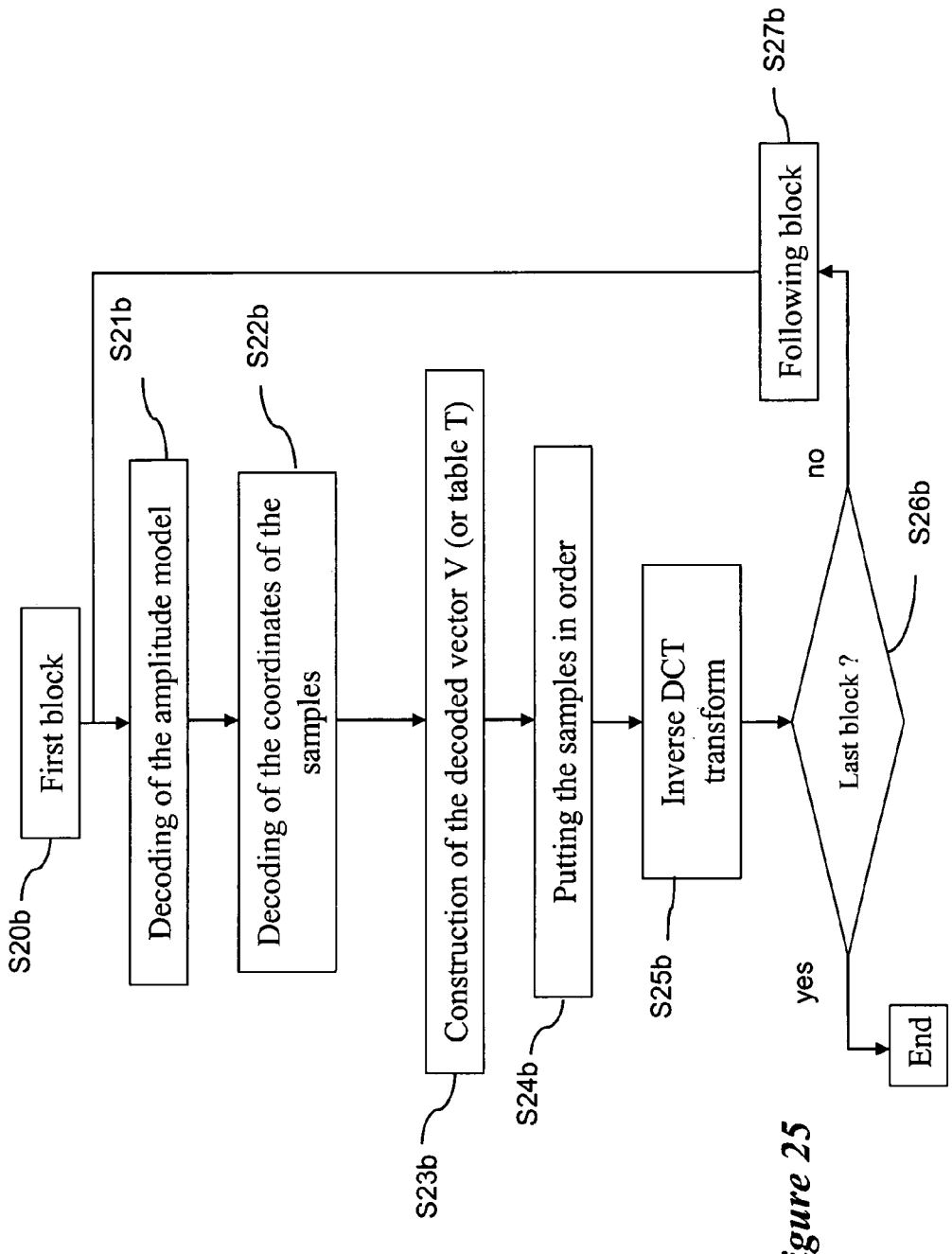
FIG. 25 represents an embodiment of a decoding method according to the third embodiment of the invention.

FIG. 25 represents an embodiment of a method of decoding data previously encoded according to the method of FIG. 22.

This method is implemented in the decoding device and comprises the steps S20b to S27b.

The method is carried out in the form of an algorithm which can be stored in whole or in part in any means of information storage capable of cooperating with the microprocessor. This storage means is readable by a computer or by a microprocessor. The storage means is integrated or not into the device, and may be removable. For example, it may comprise a magnetic tape, a diskette or a CD-ROM (fixed memory compact disk).

Step S20$b$ is an initialization at which the encoding data of the first block are considered.

The following step S21$b$ is the decoding of the amplitude model. The result is the amplitude model of the coefficients of the current block. This decoding is carried out as set out in the French patent application No. 01 06933, as follows.

The parameters of the approximation function associated with the block to be processed are read, and they are decoded if necessary.

Once this operation has been accomplished, the method will attribute, to the coordinate coefficient obtained by the displacement vector, the value of the amplitude given by the position of the coefficient by virtue of the approximation function reconstituted from its parameters. The decoding of the sign information will also be carried out so as to be able to attribute its sign to each coefficient decoded.

The following step S22$b$ is the decoding of the coordinates of the coefficients. This decoding is carried out as set out in the French patent application No. 01 06933, as follows. The path is described in order to provide the locations of the coefficients in the vector V of the table T.

The method will attribute, to the coordinate coefficient obtained by the displacement vector, the value of the amplitude given by the position of the coefficient by virtue of the approximation function reconstituted from its parameters. The decoding of the sign information will also be carried out so as to be able to attribute its sign to each coefficient decoded.

Displacement vector is understood to mean the vector of which the coordinates are the differences between the coordinates of the second point and of the first. It should be noted that in theory this solution may seem less beneficial than a conventional solution in which the position of the coefficients would be directly encoded since a difference over 32 coefficients is encoded over 6 bits instead of 5 (from −31 to +32). Nevertheless, the nature of the signal is such that in general, the coefficients of high amplitude are found to be accumulated in the same place in a sub-band. It is therefore worthwhile to encode the points with reference to each other, such that the displacement vectors remain very small on average.

The following step S23$b$ is the construction of the vector V of the table T. For each coefficient of which the coordinates have been decoded at the preceding step, the order of the coefficient in the path determines its amplitude, since the $k^{th}$ coefficient of the path receives the amplitude A(k) corresponding to the x-coordinate k according to the amplitude model.

The result of step S23$b$ is a decoded vector V or table T.

The following step S24$b$ performs the reverse operations to those of step S4$b$ at the time of encoding. The coefficients of the vector V or of the table T are ordered as a function of their respective locations in the vector V or table T to form a decoded block B'$_i$.

Figure 26:
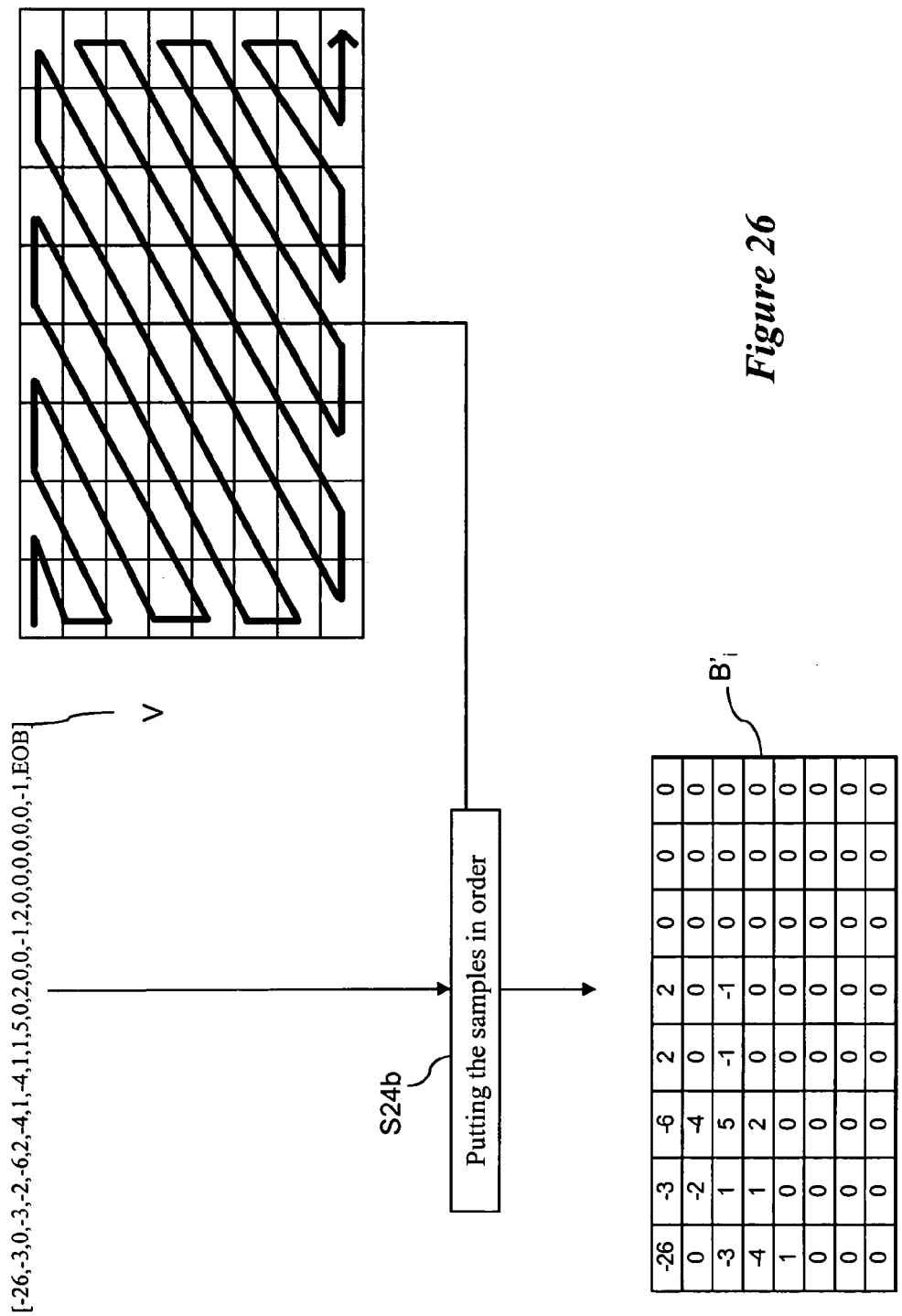
FIG. 26 represents a first variant for putting the coefficients in order as a function of their locations.

According to the first variant represented in FIG. 26, the coefficients of the vector V are considered one after the other, from first to last, and are arranged in the block B'i following the same zig-zag path as for encoding.

Figure 27:
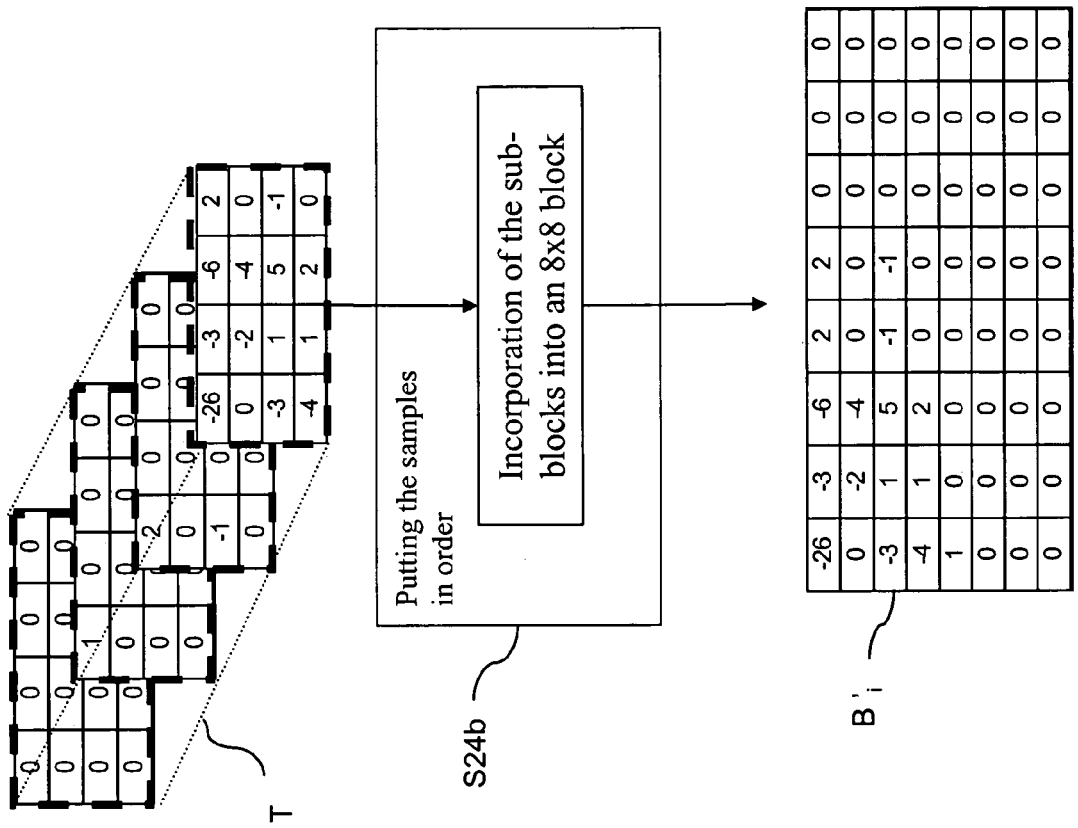
FIG. 27 represents a second variant for putting the coefficients in order as a function of their locations.

According to the second variant represented in FIG. 27, the levels of the table T are considered starting with the highest level, and are then arranged in lexicographical order in the block B'i.

The following step S25$b$ is an inverse DCT transformation of the block B'$_i$ obtained at the preceding step.

The following step S26$b$ is a test to determine whether the current block is the last block to decode.

If the response is negative, this step is followed by the step S27$b$ at which a following block is considered. Step S27$b$ is followed by the previously described step S21$b$.

If the response is positive at step S26$b$, then the decoding of the image is terminated.

Of course, the present invention is in no way limited to the embodiments described and represented, but encompasses, on the contrary, any variant form within the capability of the person skilled in the art.

The invention claimed is:

1. A method of encoding digital samples of a set of data representing physical quantities, the encoding including the determination of an amplitude model and of a path between the samples of the set, the method comprising:
   determining a number of samples to encode;
   constructing a list comprising the determined number of samples, classified by decreasing amplitude;
   determining an initial list of samples;
   calculating an encoding cost as a function of the list of samples; and
   modifying the list of samples,
   wherein said steps of calculating and modifying are reiterated to find a minimum encoding cost, and
   wherein the modification of the list of samples comprises the withdrawal of the sample of least amplitude.

2. A method according to claim 1, further comprising the step of encoding the set of data on the basis of the list of samples which provides the minimum encoding cost.

3. A method according to claim 1, in which the initial list of samples comprises all the samples of the set of data.

4. A method according to claim 1, in which the encoding cost comprises the rate of the encoded data.

5. A method according to claim 1, in which the encoding cost comprises the distortion of the encoded data.

6. A method of encoding digital samples of a set of data representing physical quantities, the encoding including the determination of an amplitude model and of a path between the samples of the set, the method comprising:
   determining a number of samples to encode; and
   constructing a list comprising the determined number of samples, classified by decreasing amplitude,
   the method further comprising an initialization of an evolutionary algorithm according to which a population of lists of samples is determined, the population comprising a predetermined number of lists, in which the determination of the population comprises the steps of:
   determining a first list of samples classified by decreasing amplitude; and
   modifying the first list by withdrawal of a predetermined number of samples of lowest amplitude, to form a second list;
   wherein said steps of determining and modifying are reiterated by taking the second list of an iteration as the first list for the next iteration, provided that the predetermined number of lists has not been reached and that the second list has a non-zero number of samples.

7. A method according to claim 6, in which the population is completed by lists picked randomly, if the second list formed has a zero number of samples before the predetermined number of lists has been reached.

8. A method according to claim 1, in which the set of data is a block of samples formed in a larger set of data.

9. A method according to claim 1, in which the data are a digital image.

10. A device for encoding digital samples of a set of data representing physical quantities, comprising means for determining an amplitude model and a path between the samples of the set, the device comprising:
- means for determining a number of samples to encode;
- means for constructing a list comprising the determined number of samples, classified by decreasing amplitude;
- means for determining an initial list of samples;
- means for calculating an encoding cost as a function of the list of samples; and
- means for modifying the list of samples,
- wherein the operation of said means for calculating and means for modifying is reiterated to find a minimum encoding cost, and
- said means for modifying the list of samples are adapted to withdraw the sample of least amplitude.

11. A device according to claim 10, further comprising means for encoding the set of data on the basis of the list of samples which provides the minimum encoding cost.

12. A device according to claim 10, wherein said means for determining the initial list of samples are adapted to form the initial list of samples to comprise all the samples of the set of data.

13. A device according to claim 10, adapted to consider an encoding cost which comprises the rate of the encoded data.

14. A device according to claim 10, adapted to consider an encoding cost which comprises the distortion of the encoded data.

15. A device according to claim 10 adapted to encode a set of data which is a block of samples formed in a larger set of data.

16. A device according to claim 10 adapted to encode data which are a digital image.

17. An encoding device according to claim 10 wherein said means for determining and construction are incorporated in:
- a microprocessor,
- a read only memory, comprising a program for processing the data, and
- a random access memory comprising registers adapted to record variables modified during the execution of said program.

18. A device for encoding digital samples of a set of data representing physical quantities, comprising means for determining an amplitude model and a path between the samples of the set, the device comprising:
- means for determining a number of samples to encode;
- means for constructing a list comprising the determined number of samples, classified by decreasing amplitude;
- the device further comprising means for initializing an evolutionary algorithm according to which a population of lists of samples is determined, the population comprising a predetermined number of lists, in which said means for determining the population comprises:
  - means for determining a first list of samples classified by decreasing amplitude; and
  - means for modifying the first list by withdrawal of a predetermined number of samples of lowest amplitude, to form a second list,
- wherein the operation of said means for determining and said means for modifying is reiterated by taking the second list of an iteration as the first list for the next iteration, provided that the predetermined number of lists has not been reached and that the second list has a non-zero number of samples.

19. A device according to claim 18 adapted to complete the population by lists picked randomly, if the second list formed has a zero number of samples before the predetermined number of lists has been reached.

* * * * *